(12) United States Patent
Brower

(10) Patent No.: US 10,310,006 B2
(45) Date of Patent: Jun. 4, 2019

(54) DC HIGH POTENTIAL INSULATION BREAKDOWN TEST SYSTEM AND METHOD

(71) Applicant: HUBBELL INCORPORATED, Shelton, CT (US)

(72) Inventor: John Edward Brower, Danbury, CT (US)

(73) Assignee: Hubbell Incorporated, Shelton, CT (US)

( * ) Notice: Subject to any disclaimer, the term of this patent is extended or adjusted under 35 U.S.C. 154(b) by 65 days.

(21) Appl. No.: 14/067,568

(22) Filed: Oct. 30, 2013

(65) Prior Publication Data
US 2014/0266233 A1    Sep. 18, 2014

Related U.S. Application Data

(60) Provisional application No. 61/799,040, filed on Mar. 15, 2013.

(51) Int. Cl.
*G01R 31/14* (2006.01)
*G01R 31/333* (2006.01)

(52) U.S. Cl.
CPC .......... *G01R 31/14* (2013.01); *G01R 31/3336* (2013.01)

(58) Field of Classification Search
CPC .... G01R 31/14; G01R 31/025; G01R 35/005; G01R 31/08; G01R 31/1272; G01R 31/02; G01R 31/024; G01R 27/18
USPC ....... 324/509, 541, 544, 551, 557, 508, 512, 324/520, 521, 522, 523, 531, 76.13, 73.1, 324/74, 99 R
See application file for complete search history.

(56) References Cited

U.S. PATENT DOCUMENTS 3,259,845 A * 7/1966 Cohen ................ G01R 19/0023
324/123 R
3,418,573 A * 12/1968 Alford ............. G01R 31/31917
324/73.1
(Continued)

FOREIGN PATENT DOCUMENTS

CN    201514184 U    6/2010
CN    201514530 U    6/2010
(Continued)

*Primary Examiner* — Patrick Assouad
*Assistant Examiner* — Taqi R Nasir
(74) *Attorney, Agent, or Firm* — Dickinson Wright, PLLC

(57) ABSTRACT

Test system and method comprise a controller, which can be microprocessor derived and include operating system for programmability, to control low voltage signals and feedback for managing the test system. High potential test system can include an amplifier comprising solid-state and/or passive components amplifying lower voltage signal to produce higher voltage output signal based on signal monitoring and control provided by controller. Controlled higher voltage output signal can be injected into high voltage multiplier circuit resulting in high DC voltage output voltage up to 50 kV or higher range. The monitoring can include feedback indicative of higher voltage signal output of amplifier and/or high DC voltage output voltage of high voltage multiplier circuit. System feedback and control can be fully automated, or selectively user-controlled via a user interface providing continuous and/or selective monitoring and display of system parameters and measured signal inputs and/or outputs.

24 Claims, 27 Drawing Sheets

(56) References Cited

U.S. PATENT DOCUMENTS

| | | | |
|---|---|---|---|
| 3,641,685 A | 2/1972 | Zawels et al. | |
| 3,720,971 A | 3/1973 | Wyness et al. | |
| 3,964,349 A | 6/1976 | Von Arnold et al. | |
| 3,968,426 A | 7/1976 | Ward et al. | |
| 3,986,107 A | 10/1976 | Dickson et al. | |
| 3,996,569 A | 12/1976 | Saunders | |
| 4,332,029 A * | 5/1982 | Campbell | G06F 11/076 324/73.1 |
| 4,408,157 A | 10/1983 | Beaubien | |
| 4,608,875 A | 9/1986 | Wallace | |
| 4,646,299 A * | 2/1987 | Schinabeck | G01R 31/3191 324/73.1 |
| 4,742,722 A | 5/1988 | Wallace | |
| 5,059,892 A * | 10/1991 | Stoft | G01R 1/20 324/73.1 |
| 5,267,138 A * | 11/1993 | Shores | H02M 3/3376 363/132 |
| 5,273,497 A | 12/1993 | Wallace | |
| 5,307,019 A | 4/1994 | Robey et al. | |
| 5,354,245 A | 10/1994 | Wallace | |
| 5,514,967 A | 5/1996 | Zelm | |
| 5,828,222 A | 10/1998 | Chen | |
| 5,936,419 A | 8/1999 | Chen | |
| 5,936,988 A * | 8/1999 | Partlo | G03F 7/70025 372/38.04 |
| 6,011,398 A | 1/2000 | Bald et al. | |
| 6,054,865 A | 4/2000 | Bald | |
| 6,119,819 A | 9/2000 | Von Kaler | |
| 6,515,484 B1 | 2/2003 | Bald et al. | |
| 6,526,324 B1 * | 2/2003 | Kinoshita | G05B 19/0423 318/564 |
| 6,538,420 B2 | 3/2003 | Bald et al. | |
| 6,549,385 B1 | 4/2003 | Bald et al. | |
| 6,557,909 B2 | 5/2003 | Morris | |
| 6,608,493 B2 * | 8/2003 | Hensler | G01R 31/027 324/439 |
| 6,744,259 B2 | 6/2004 | Bald | |
| 6,994,383 B2 | 2/2006 | Morris | |
| 7,025,301 B1 | 4/2006 | Notarnicola | |
| 7,026,822 B1 | 4/2006 | Bald et al. | |
| 7,053,624 B2 * | 5/2006 | Klijn | G01R 31/3278 324/415 |
| 7,053,648 B2 * | 5/2006 | DeVey | G01R 31/31924 324/73.1 |
| 7,111,805 B2 | 9/2006 | Notarnicola | |
| 7,139,668 B2 * | 11/2006 | Bechhoefer | G01R 31/311 370/242 |
| 7,164,274 B2 * | 1/2007 | Pharn | G01R 31/11 324/533 |
| 7,180,297 B2 * | 2/2007 | Deak | G01R 31/3278 324/418 |
| 7,248,986 B2 * | 7/2007 | Klijn | G01R 31/3272 307/11 |
| 7,330,342 B2 | 2/2008 | Bald et al. | |
| 7,592,820 B2 | 9/2009 | Laasko et al. | |
| 7,595,669 B2 | 9/2009 | Curl et al. | |
| 7,697,255 B2 | 4/2010 | Curl et al. | |
| 7,869,214 B2 | 1/2011 | Blank et al. | |
| 7,952,362 B2 | 5/2011 | Baldauf et al. | |
| 7,959,155 B2 | 6/2011 | Templeton et al. | |
| 7,970,559 B2 * | 6/2011 | Rogovin | G01R 31/025 324/525 |
| 8,045,303 B2 | 10/2011 | Curl et al. | |
| 8,299,813 B2 | 10/2012 | Xie | |
| 8,351,216 B2 | 1/2013 | Fotherby | |
| 2003/0090257 A1 | 5/2003 | Howes | |
| 2003/0222654 A1 | 12/2003 | Furse et al. | |
| 2004/0046570 A1 * | 3/2004 | Teich | G01R 31/024 324/541 |
| 2004/0189271 A1 * | 9/2004 | Hansson | H02M 3/33515 323/283 |
| 2005/0083066 A1 | 4/2005 | Tani et al. | |
| 2005/0133218 A1 | 6/2005 | Plomp | |
| 2006/0027914 A1 | 2/2006 | Bish et al. | |
| 2006/0113683 A1 | 6/2006 | Dean et al. | |
| 2006/0151873 A1 | 7/2006 | Fery et al. | |
| 2006/0172685 A1 | 8/2006 | O'Brien | |
| 2006/0255315 A1 | 11/2006 | Yellowaga et al. | |
| 2006/0268533 A1 | 11/2006 | Miller et al. | |
| 2007/0013054 A1 | 1/2007 | Ruchert et al. | |
| 2007/0022909 A1 | 2/2007 | Kennedy et al. | |
| 2007/0050159 A1 * | 3/2007 | Ewers | G01R 15/125 702/62 |
| 2007/0051773 A1 | 3/2007 | Ruchert et al. | |
| 2010/0264911 A1 * | 10/2010 | Kuo | G01R 33/0029 324/207.2 |
| 2011/0148433 A1 | 6/2011 | Blank et al. | |
| 2011/0216453 A1 | 9/2011 | Haines et al. | |
| 2012/0013344 A1 | 1/2012 | Blank et al. | |
| 2012/0098672 A1 * | 4/2012 | Restrepo | H02H 3/027 340/815.45 |
| 2012/0144256 A1 * | 6/2012 | Bailey | G01R 31/3177 714/738 |
| 2012/0313655 A1 * | 12/2012 | Bald | G01R 31/025 324/750.01 |
| 2014/0266233 A1 * | 9/2014 | Brower | G01R 31/14 324/509 |
| 2014/0306733 A1 * | 10/2014 | Yanagisawa | G01R 15/16 324/99 R |

FOREIGN PATENT DOCUMENTS

| | | |
|---|---|---|
| CN | 201516461 U | 6/2010 |
| CN | 201562032 U | 8/2010 |
| CN | 201565799 U | 9/2010 |
| CN | 201823955 U | 5/2011 |
| CN | 201871965 U | 6/2011 |
| CN | 201906814 U | 7/2011 |
| CN | 102243288 A | 11/2011 |
| CN | 102337102 A | 2/2012 |
| CN | 102337525 A | 2/2012 |
| CN | 102337573 A | 2/2012 |
| CN | 102554289 A | 7/2012 |
| CN | 202748444 U | 2/2013 |
| JP | 2003-277006 A | 10/2003 |
| WO | 9518385 A1 | 7/1995 |
| WO | 2007045004 A1 | 4/2007 |
| WO | 2007068018 A2 | 6/2007 |
| WO | 2011124338 A1 | 10/2011 |

* cited by examiner

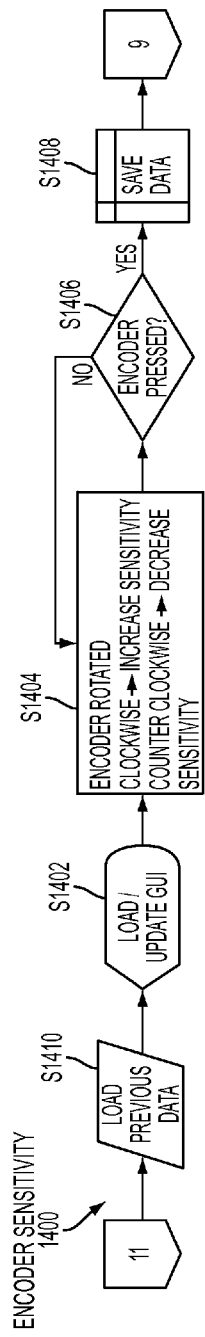
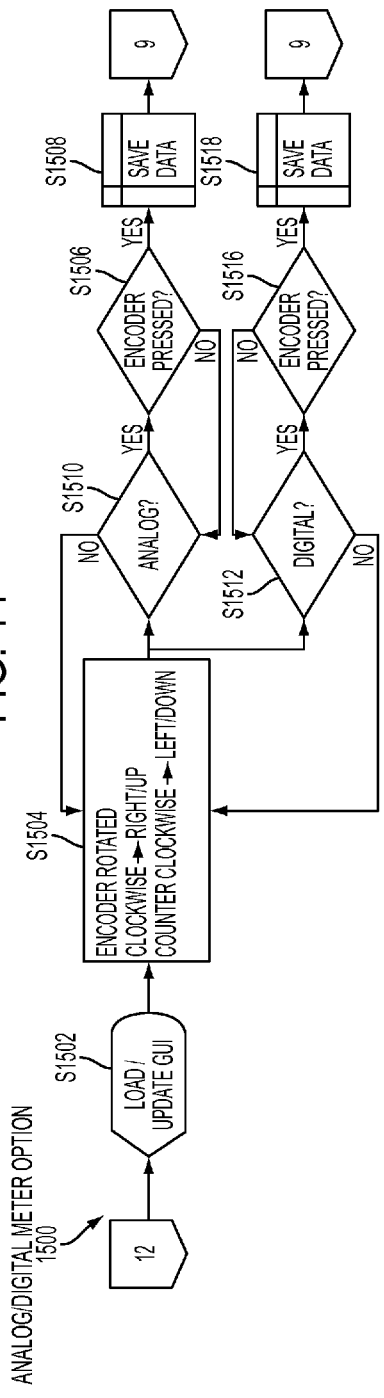
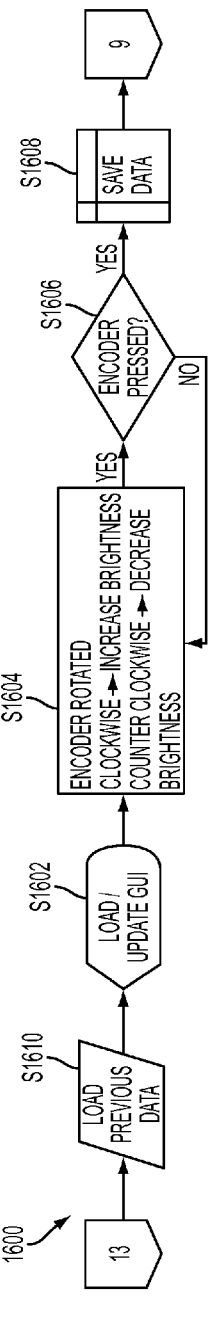
FIG. 14
FIG. 15
FIG. 16

DC HIGH POTENTIAL INSULATION BREAKDOWN TEST SYSTEM AND METHOD

CROSS-REFERENCE TO RELATED APPLICATION

This application claims benefit under 35 U.S.C. § 119(e) of U.S. provisional patent application Ser. No. 61/799,040 filed Mar. 15, 2013, the disclosure of which is hereby incorporated by reference in its entirety.

BACKGROUND OF THE INVENTION

1. Field of the Invention

Generally, the present invention is in the field of high potential (HIPOT) test systems, and more specifically relates to DC High Potential (or High Voltage) insulation breakdown test system and method.

2. Discussion of the Background of the Invention

HIPOT test systems can be used to verify that the insulation of a product or component is sufficient to protect the operator from electrical shock. In a typical HIPOT test, high voltage is applied between a product's current-carrying conductors and its metallic shielding. The resulting leakage current is monitored by the HIPOT test system.

For example, in a conventional insulation resistance rest, a test DC voltage is applied, and measured voltage and measured current values are used to calculate the resistance of the insulation.

Conventional HIPOT insulation breakdown testers have utilized a line frequency (50/60 Hz) variable autotransformer to raise and lower voltage, combined with a high voltage transformer and multiplier circuit. Having such an autotransformer configuration may be disadvantageous for some situations such as when output test voltage and/or performance of the HIPOT tester need to be monitored or adjusted.

SUMMARY OF THE INVENTION

Exemplary embodiments of the present invention address at least the above problems and/or disadvantages and provide at least the advantages described below.

Exemplary embodiments of the present invention provide test systems and methods which may avoid using a variable autotransformer, replacing it with an amplifier/driver including a Pulse-Width Modulation (PWM) amplifier with solid-state and passive components configured to output a controlled amplified PWM signal in response to a PWM control signal, such as for example low voltage, high frequency PWM control signal.

According to an exemplary implementation, amplified PWM signal can be filtered via a low-pass filter, resulting in a PWM dependent sine wave on the filter output, where this output signal can be injected into a primary side of a high frequency step-up transformer to output a higher voltage AC signal. This higher voltage AC signal can be injected into a high voltage multiplier circuit resulting in a controlled high DC output voltage.

According to an exemplary implementation, PWM control signal can be modified based on one or more feedback signals indicative of the characteristics of the controlled high DC output voltage and/or characteristics of any other output signal generated in response to the PWM control signal, such as amplified PWM signal, PWM dependent sine wave, or higher voltage AC signal.

Other exemplary embodiments of the present invention provide test systems and methods using AC controls and driver configured to output a controlled AC signal in response to an AC input control signal.

According to yet other exemplary implementations, controlled AC signal can be used to drive a signal amplifier, resulting in higher power AC output signal, where this output signal can be injected into a primary side of a high frequency step-up transformer to output a higher voltage AC signal. This higher voltage AC signal can be injected into a high voltage multiplier circuit resulting in a controlled high DC output voltage.

According to yet other exemplary implementations, AC input control signal can be modified based on one or more feedback signals indicative of the characteristics of the controlled high DC output voltage and/or characteristics of any other output signal generated in response to the AC input control signal, such as controlled AC signal, AC signal dependent sine wave, or higher voltage AC signal.

According to yet another exemplary implementation of embodiments of the present invention, DC output voltage can be greater than, for example, about 50 kV, establishing a maximum power output of about 2 kW.

Exemplary embodiments of the present invention provide test systems and methods utilizing a controller, which can be microprocessor derived and include an operating system for programmability to control, for example low voltage, signals and feedback for managing the test system.

Yet further exemplary implementations of the present invention provide systems and methods utilizing a robust user interface, including without limitation GUI and/or voice-controlled interface, to monitor and control test system performance and output.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIGS. 6(A)-6(D), 7(A)-7(B), 8(A)-8(B), 9(A)-9(B), 10(A)-10(B),11-16, and 17(A)-17(B) are diagrams illustrating examples of process flows according to exemplary implementations of systems and methods according to exemplary embodiments of the present invention.

DETAILED DESCRIPTION OF EXEMPLARY EMBODIMENTS

Figure 1:
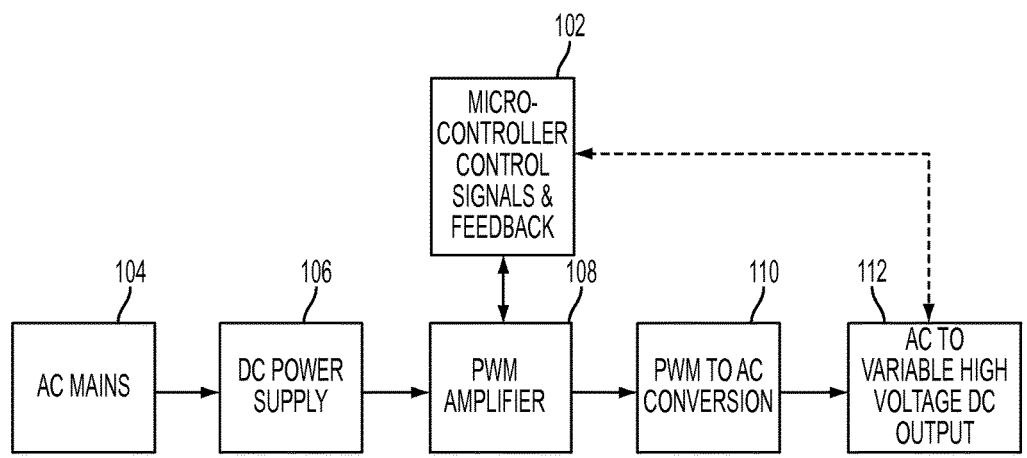
FIG. 1 is a generalized block diagram illustrating a system and process flow according to an exemplary embodiment of the present invention.

Referring now to the drawings, wherein like reference numerals designate identical or corresponding parts throughout the several views, embodiments of the present invention are shown in schematic detail.

The matters defined in the description such as a detailed construction and elements are nothing but the ones provided to assist in a comprehensive understanding of the invention. Accordingly, those of ordinary skill in the art will recognize that various changes and modifications of the embodiments described herein can be made without departing from the scope and spirit of the invention. Also, well-known functions or constructions are omitted for clarity and conciseness. Certain exemplary embodiments of the present invention are described below in the context of commercial application. Such exemplary implementations are not intended to limit the scope of the present invention, which is defined in the appended claims.

Figure 4:
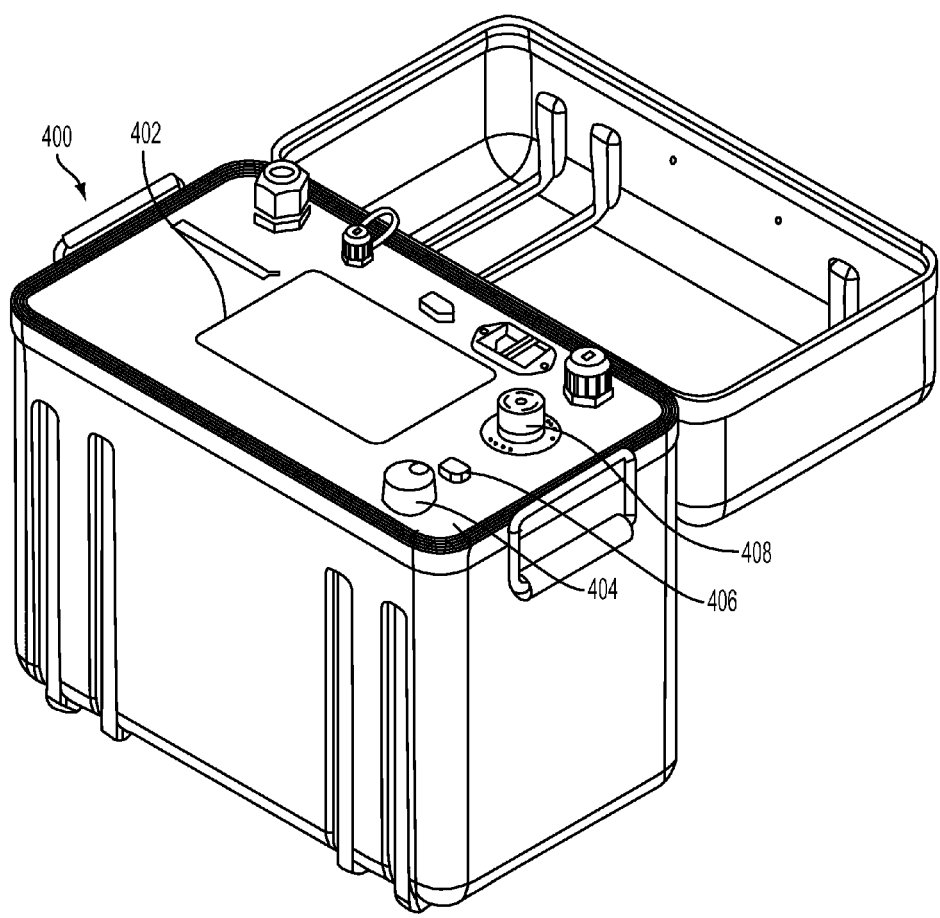
FIG. 4 illustrates an example of an enclosure containing a system according to an exemplary embodiment of the present invention.

FIG. 1 illustrates an exemplary embodiment of the present inventions where a test system (100) can be used for high voltage DC breakdown testing of dielectric/insulation in materials such as without limitation cables, connectors, and the like. In an exemplary implementation, variable high voltage DC output (112) can be developed by a series of subsystems, under the control and monitoring of the control system (102), by means of a control algorithm. The overall test system (100) can be physically contained in a portable, rack-mount, or open enclosure. In an exemplary implementation which may provide more flexibility, a subsystem according to an embodiment of the present invention comprises an AC mains input (104), for example of 85-265 AC @ 45-65 Hz. As illustrated in FIG. 1, the AC mains can be developed into a DC voltage supply (106) for use in a PWM Amplifier stage. FIG. 4 shows a non-limiting example of a portable enclosure 400 which can contain a test system 100.

According to exemplary embodiments of the present invention PWM Amplifier (108) is configure to be provided with control and/or be monitored by a control system (102) to output high powered PWM signals which are converted to AC in the next stage (110) which steps the lower voltage high powered signal to a variable high voltage output (112) greater than 50 kV.

Referring to a more detailed diagram of FIG. 2, a test system according to an exemplary embodiment of the present invention can comprise, for example and without limitation three sections: a switch mode power supply section (200) which supplies DC power rails to the remaining sections; a signal amplification section (240) which amplifies an input from the control system or external source (for example, system or source (102) as generally illustrated in FIG. 1), to an acceptable level for a final stage; and a final stage (260) which takes an AC (sine wave) input and provides a high voltage DC output, which is variable and dependent upon the input.

Figure 2A:
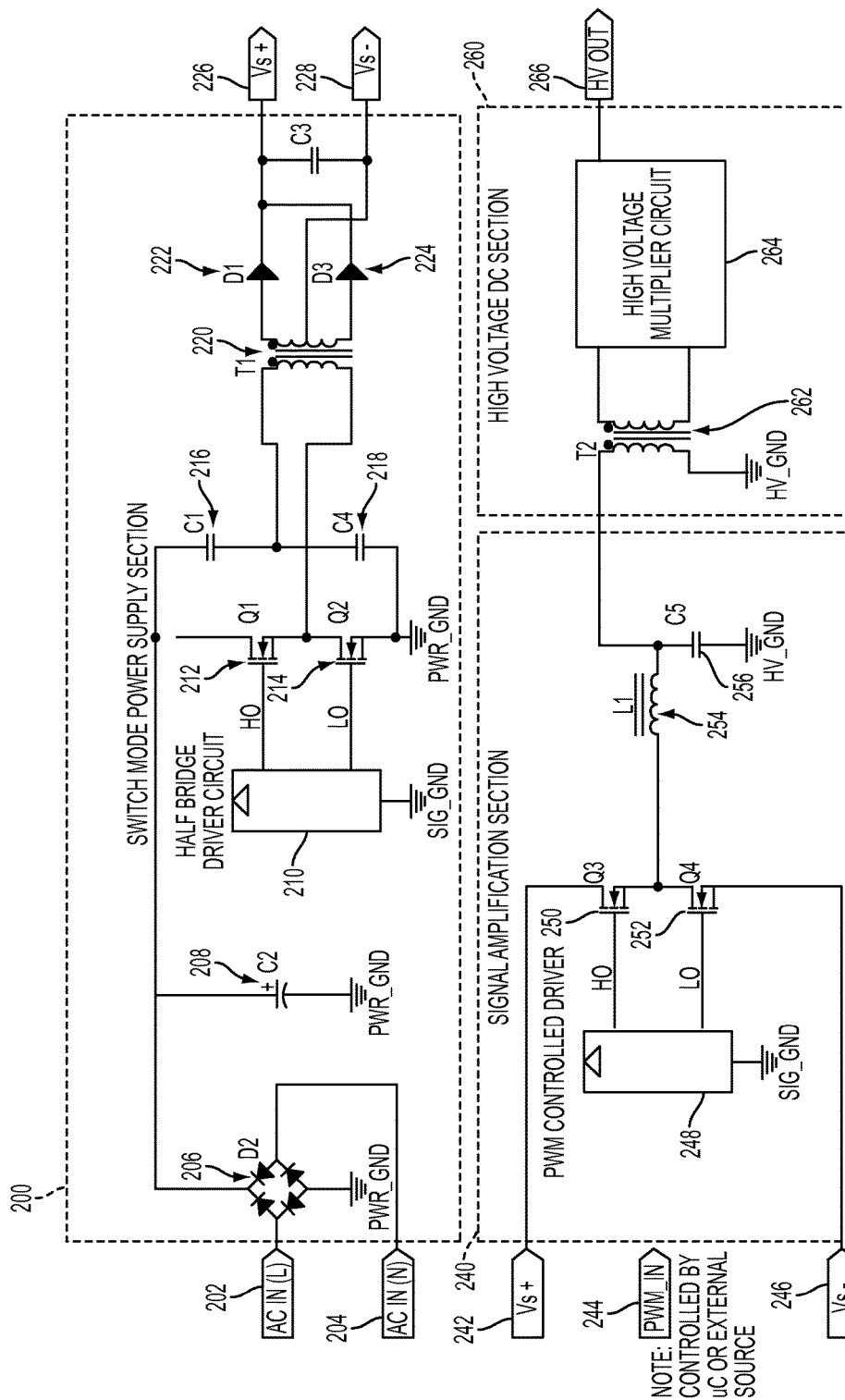
FIG. 2(A) illustrates examples of circuit components and configurations for implementing methodology and functionality in accordance with exemplary embodiments of the present invention.

In an exemplary implementation, switch mode power supply section (200) can be configure using an off-the-shelf module or combination of modules, or implemented as illustrated in FIG. 2(A), where a mains line voltage is applied to input L (202) and N (204), then rectified to a DC rail by a diode bridge (206) and bulk charge capacitor (208). As further shown in the example of FIG. 2, this DC rail is then chopped by the collective actions of the PWM half bridge gate driver (210) and n-channel MOSFETs (212 and 214). Following this step, the resulting high power PWM signal creates an oscillation between capacitors C1 and C4 (216 and 218), and multi-tap transformer T1 (220). The secondary taps of T1 are rectified by diodes D1 and D3 (222 and 224). A capacitor array C3 provides the rail voltages Vs+ and Vs− (226 and 228).

Further, in an exemplary implementation, second section (240) of the test system provides the variable signal amplification. The low voltage PWM signal (244) that is amplified is provided by a control system or external source, (such as without limitation 102) and provides an input to the PWM controlled gate driver (248). MOSFETs Q3 and Q4 (250 and 252) are switched dependent upon the PWM signal applied to the driver (248). The resulting amplified PWM signal is low-pass filtered by the combination of L1 (254) and C5 (256), this creates a PWM dependent AC signal.

Still further, in an exemplary implementation, in a third section (260), the AC signal generated by the filter (L1, C5) in the previous stage becomes the driving input to the step-up transformer T2 (262). The secondary side of T2 (262) outputs a higher voltage AC signal. This higher voltage AC signal is then converted, in the high voltage multiplier circuit (264), to a high voltage DC (266).

Figure 2B:
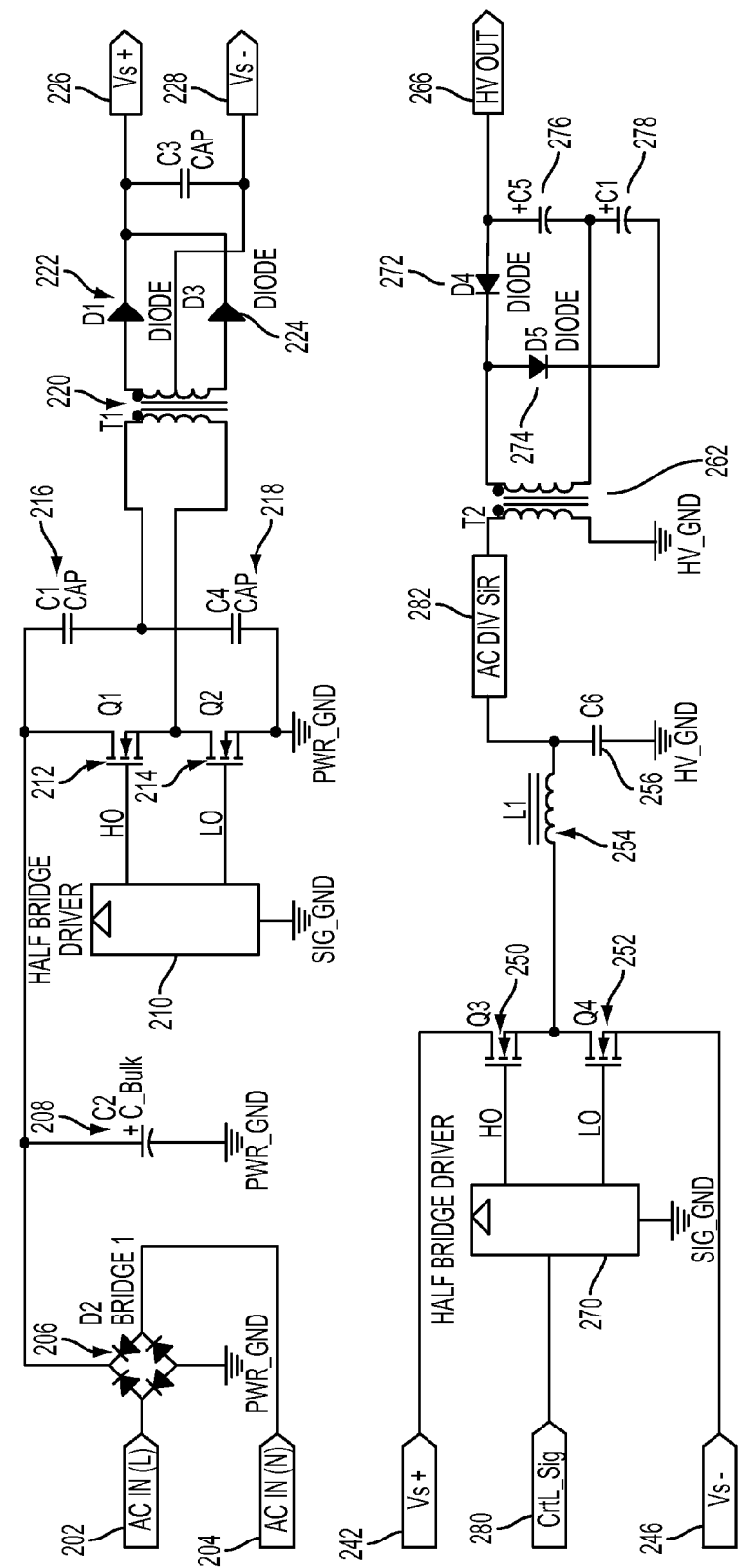
FIG. 2(B) illustrates other examples of circuit components and configurations for implementing methodology and functionality in accordance with exemplary embodiments of the present invention.

Yet still further, an exemplary implementation shown in FIG. 2(B) utilizes AC controls and drive including a Half bridge Driver (270), which accepts an AC input control signal (280) provided by a control system or external source. MOSFETs Q3 and Q4 (250 and 252) are switched dependent upon the AC input signal applied to the driver (270). The resulting amplified AC signal is low-pass filtered by the combination of L1 (254) and C5 (256), this create an AC drive signal (282) dependent on the AC input control signal (280).

In the exemplary implementation of FIG. 2(B), the AC drive signal (282) generated by the filter (L1, C5) in the previous stage becomes the driving input to the step-up transformer T2 (262). The secondary side of T2 (262) outputs a higher voltage AC signal. This higher voltage AC signal is then converted, using an exemplary circuit including diodes D4 (272) and D5 (274) and capacitors C5 (276) and C7 (278), to a high voltage DC signal (266).

Figure 3A:
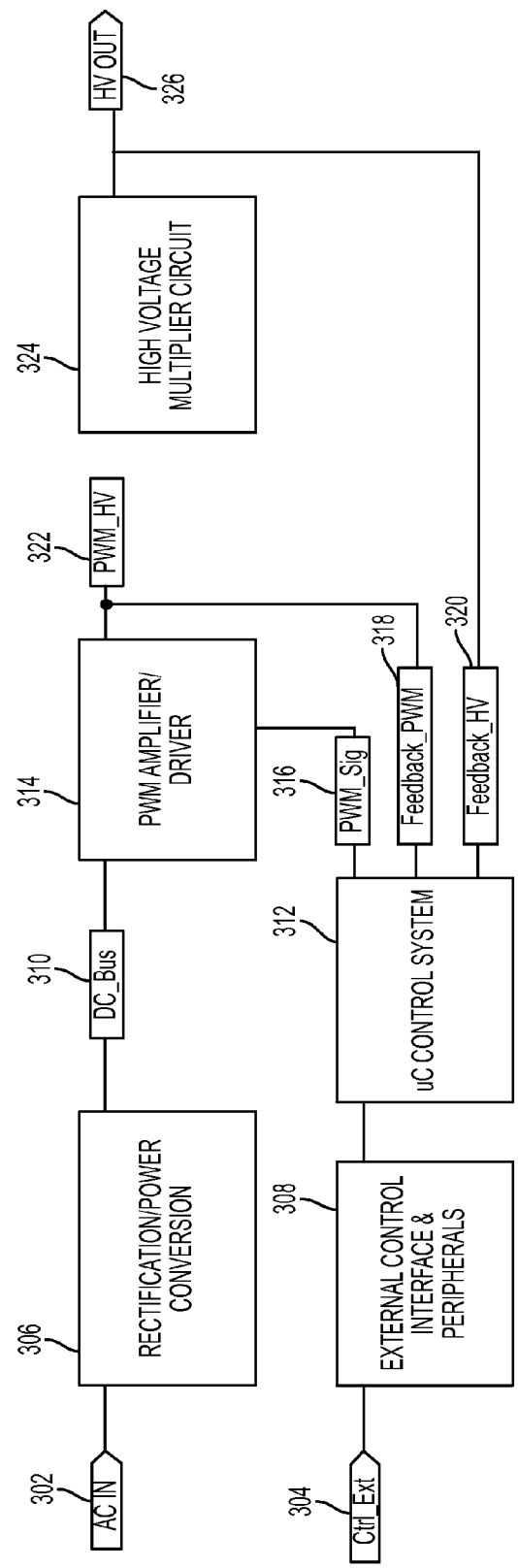
FIG. 3(A) is a generalized diagram illustrating an example of signal paths and system components according to exemplary embodiments of the present invention.

FIG. 3(A) conceptually illustrates signal paths and system blocks of a control system according to an exemplary embodiment of the present inventions. The three types of signals in this exemplary system are power, control, and feedback. The power signals energize the test system for operation (302,310,322,326). The PWM control signal (316) can be provided by a control system (312), which includes a programmable microprocessor or controller, μC, and enabled for input (304) from an external control interface (308). The feedback signals (318,320) supply monitoring of the test system via the control system, and according to an exemplary implementation, adjustments can be made with reference to the feedback signals to ensure regulated operation of the test system. In an exemplary implementation, the monitoring can be essentially real time.

Figure 3B:
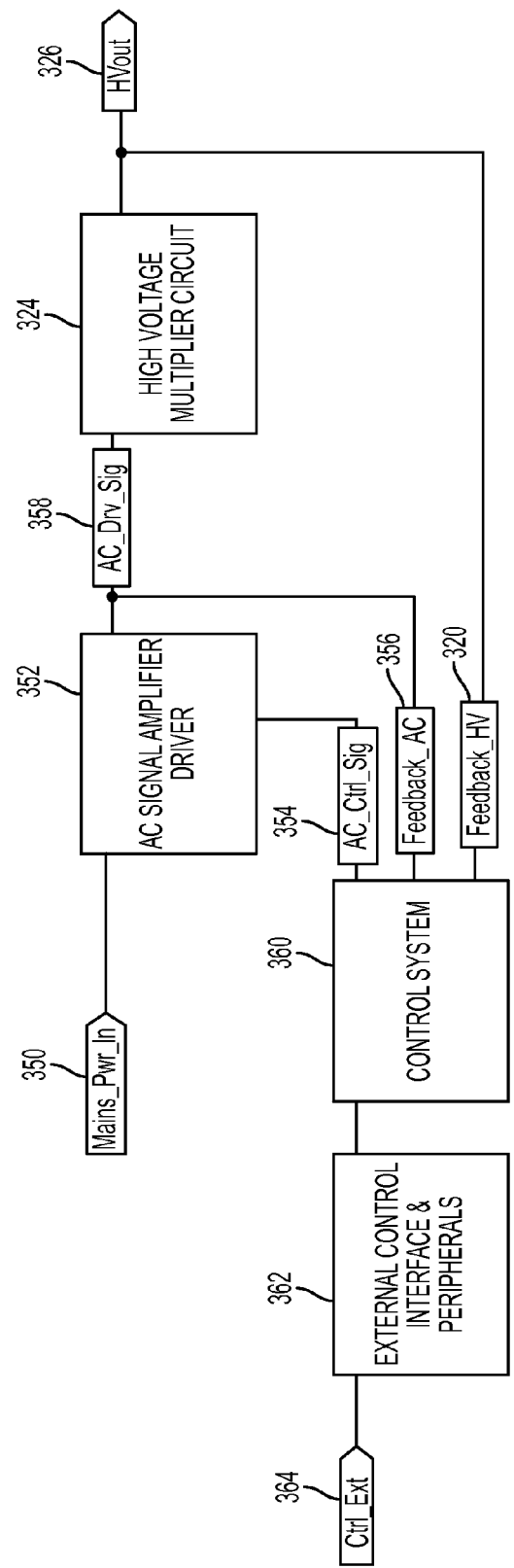
FIG. 3(B) is a generalized diagram illustrating another example of signal paths and system components according to exemplary embodiments of the present invention.

FIG. 3(B) conceptually illustrates signal paths and system blocks of a control system according to another exemplary embodiment of the present inventions. Similar to the example of FIG. 3(A), three types of signals in this exemplary system are also power, control, and feedback. The power signals energize the test system for operation (350, 358,326). The AC control signal (354) can be provided by a control system (360), which includes a programmable microprocessor or controller, μC, and enabled for input (364) from an external control interface (362). The feedback signals (356,320) supply monitoring of the test system via the control system, and according to an exemplary implementation, adjustments can be made with reference to the feedback signals to ensure regulated operation of the test system. In an exemplary implementation, the monitoring can be essentially real time.

Referring to FIGS. 3(A) and 3(B), according to yet another exemplary implementation, the adjustments can be made via either an external control interface (308, 362) or an internal control interface provided as part of the control system (312, 360), or any combination of such interfaces. In yet another exemplary implementation, the control system can receive and transmit information via wireless communication and/or web-based communication, including for example and without limitation receive control information such as input (304, 364) and transmit for monitoring purposes feedback information such feedback signals (318, 356 and/or 320). In yet another exemplary implementation, the control system can autonomously, for example without input (304, 364) or from interface (308,362), perform adjustments, for example to control signal (316, 354) based on either preset or variable autonomous control parameters, with reference to the feedback signals (318, 356 and/or 320) to ensure regulated operation of the test system. In yet another exemplary implementation, autonomous control parameters can be communicated to the control system (312, 360) wirelessly, via an external interface (308, 362), or via an internal interface, or any combination thereof.

Figure 3C:
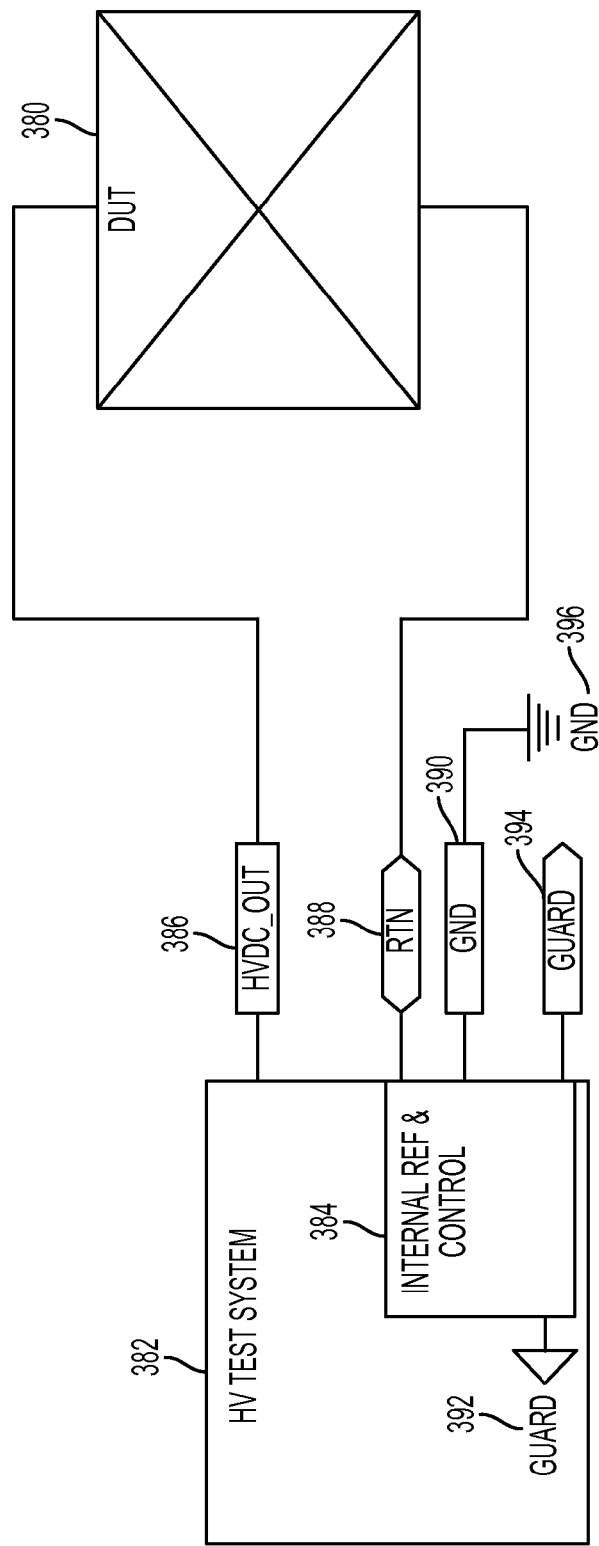
FIG. 3(C) is a generalized diagram illustrating an example of application of test systems according to various exemplary embodiments of the present invention.

FIG. 3(C) illustrates a test system (382) according to exemplary embodiments of the present invention (as shown for example in FIGS. 3(A) and 3(B)) configured to supply test voltage output (386), such as high voltage greater than 50 kV, to a device under test (DUT) (380). Referring to the example of FIG. 3(C), test system (382) includes an internal reference and control (384) having return current path (RTN) 388 for signal measurement, GND (390) providing an external ground reference (396) for the test system (382), and an internal system common signal reference GUARD (392, 394). Examples of a DUT (380) include, but are not limited to cables, terminators, motors, generators, insulators, bushings, and the like.

Figure 5:
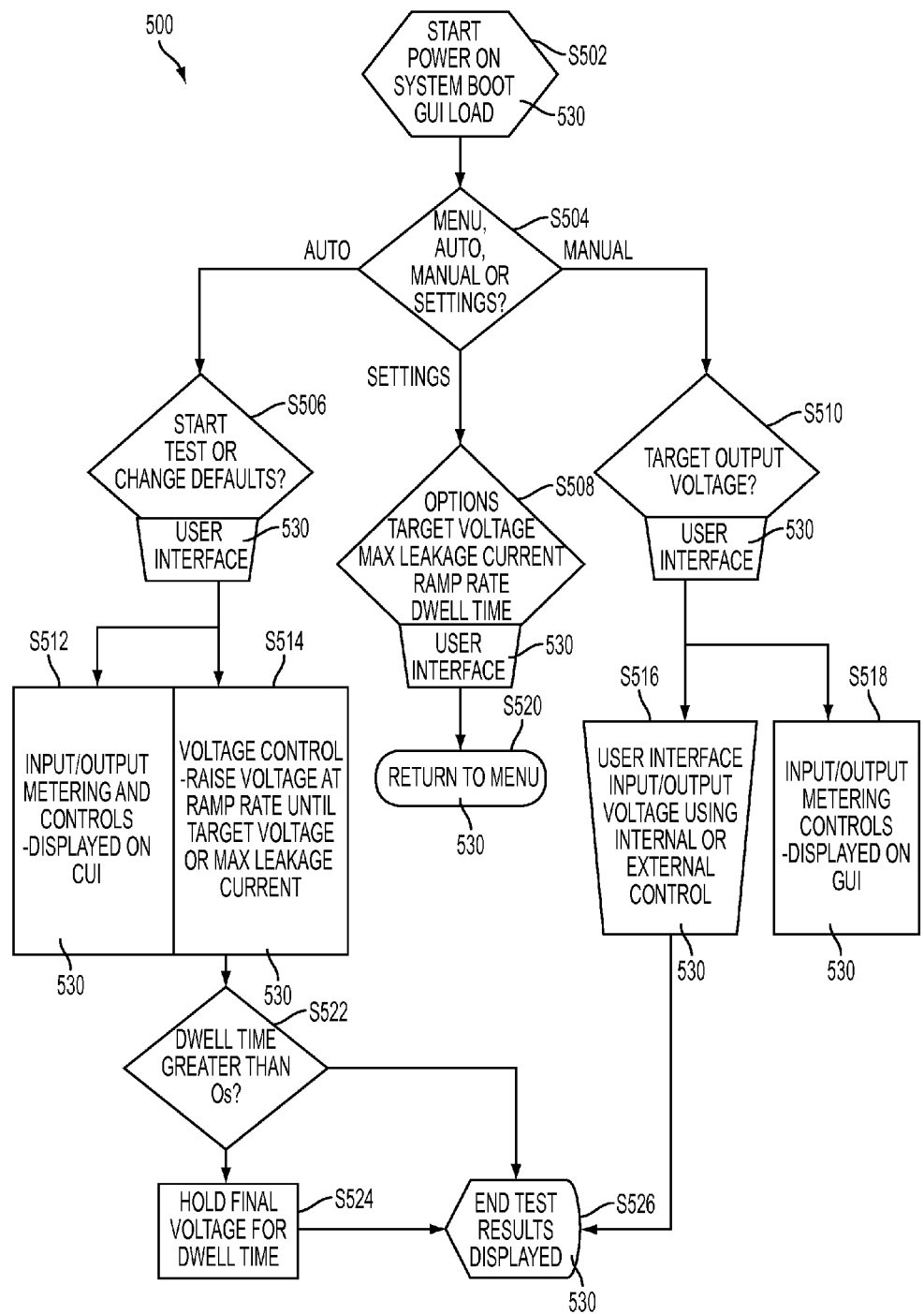
FIG. 5 is a diagram illustrating an example of a process flow according to an exemplary implementation of system and methods according to exemplary embodiments of the present invention.

FIG. 5 illustrates an example of process flow (500) for automatic (auto) and manual operation according to an exemplary implementation of a system and method of exemplary embodiments of the present invention. Referring to the example of FIG. 5, a graphical user interface (GUI) is provided for input of control information and for displaying monitored information. In an exemplary implementation, setting for parameters, such as for example and without limitation target voltage, maximum leakage current, ramp rate, and dwell time, can be input/changed by user via a GUI, or preset as defaults, or both. According to an exemplary implementation, metering can occur as an essentially simultaneous process for control and information display to the user. According to another exemplary implementation, a user can be given an option to abort from any mode of operation at any time.

As illustrated in the example of FIG. 5, GUI (300) continuously displays control and monitored information during processing once the system as powered on (S502). After power on (S502), GUI (300) allows system user to select (S504) automatic or manual operating mode, or to set system parameters (S508) and return to GUI's main menu (S520). In automatic mode (S506), the system proceed to initiate the test by allowing the user to change default settings and providing automatic voltage generation and control (S512, S514) during test dwell time (S522, S524). In manual mode (S510), the system allows the user to control test parameters and perform the test accordingly (S516, S518). End test results for both manual and automatic mode are displayed (S526) on the system's GUI (530).

Exemplary embodiments of the present invention can implement GUI configurations and general process flows illustrated in the FIG. 5 as described in more detail with reference to FIGS. 6-15 as follows. The examples of FIG. 6-15 reference user interface of an exemplary system 400 shown in FIG. 4 where user interface includes an on-screen display (402), rotatable encoder (404), start press switch (406) and emergency stop press switch (408). One of ordinary skill in the art would readily appreciate that various user interfaces, such as for example, keyboard, touch-screen, voice-activated, and others can be used to provide control and display without departing from the spirit and teachings of the present invention. For example, encoder (404) can incorporate the functionality of a press switch, for example to eliminating the need for switch (406) and/or switch (408), or to disable switch (406) and/or switch (408) for any or all operations. Also, for example, on-screen display (402) can be a touch-screen-type display incorporating any, or all, user interface functionality of encoder (404) and/or switch (406) and/or switch (408), for example to eliminating the need for encoder (404) and/or switch (406) and/or switch (408), or to disable encoder (404) and/or switch (406) and/or switch (408) for any or all operations.

Figure 6A:
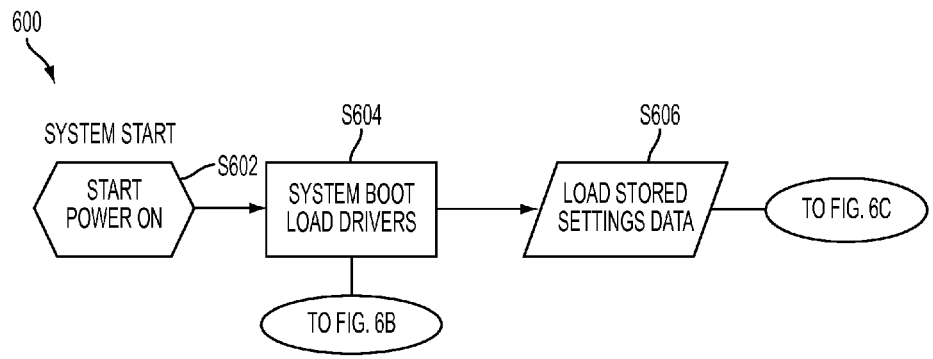

Referring to FIG. 6(A), system start process (600) includes powering on the system (S602), followed by system boot (S604) loading appropriate drivers, and loading stored settings data (S606).

Figure 6B:
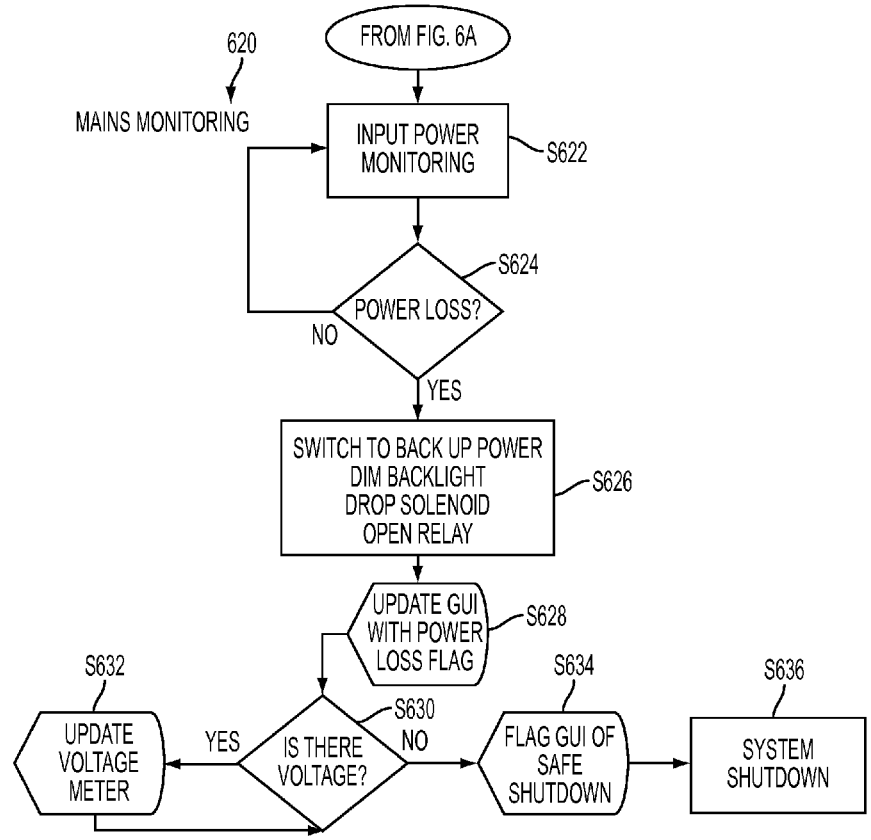

As illustrated in FIG. 6(B), mains monitoring process (620), initiated upon system start, includes input power monitoring (S622) and checking for power loss (S624). If there is no power loss, input power monitoring (S622) continues. If there is power loss, then the system can switch to back up power (S626), which includes, for example, dimming system's backlight to conserve power, and opening a relay connecting mains power to the system. GUI can also be updated to show power loss (S628), and if voltage is detected (S630) updated to show voltage meter reading (S632). If voltage is not detected, the system can proceed to shutdown (S636) with the GUI updated accordingly (S634).

Figure 6C:
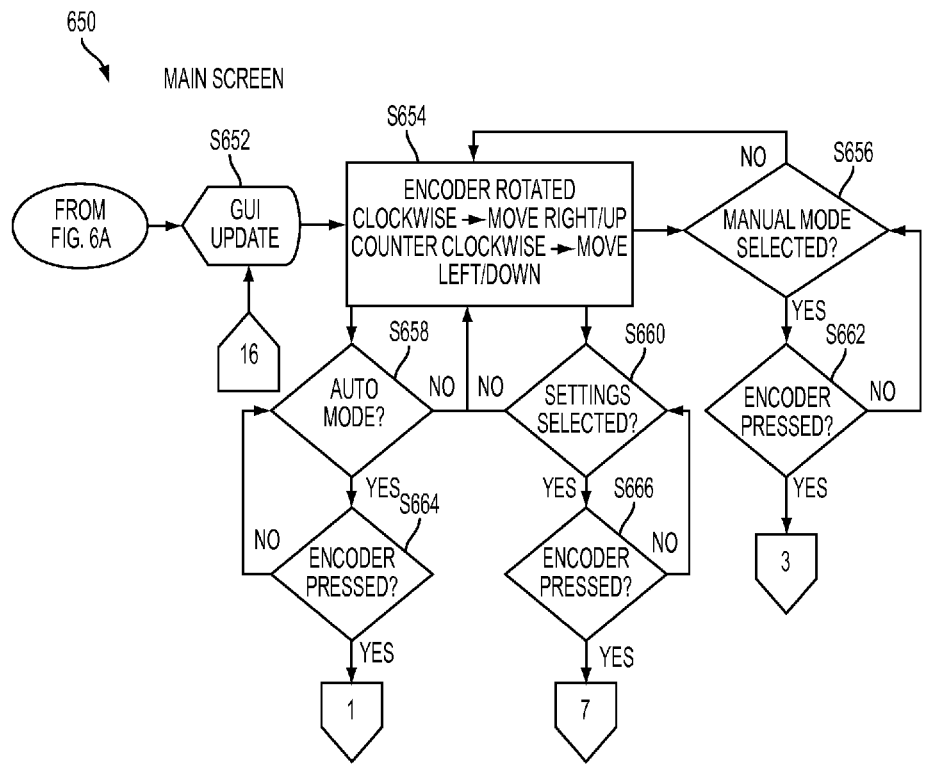

Referring to FIG. 6(C), main screen process (650), initiated upon system start, provides GUI (S652), and when encoder (404) is rotated (S654), the system checks whether manual mode (S656), auto mode (S658), or settings mode (S660) is selected, and then if the encoder is pressed (S662), (S664) or (S666) an operational process associated with the corresponding selected mode is initiated, as described below with reference to FIGS. 7(A)-7(B) through 17(A)-17(B).

Figure 6D:
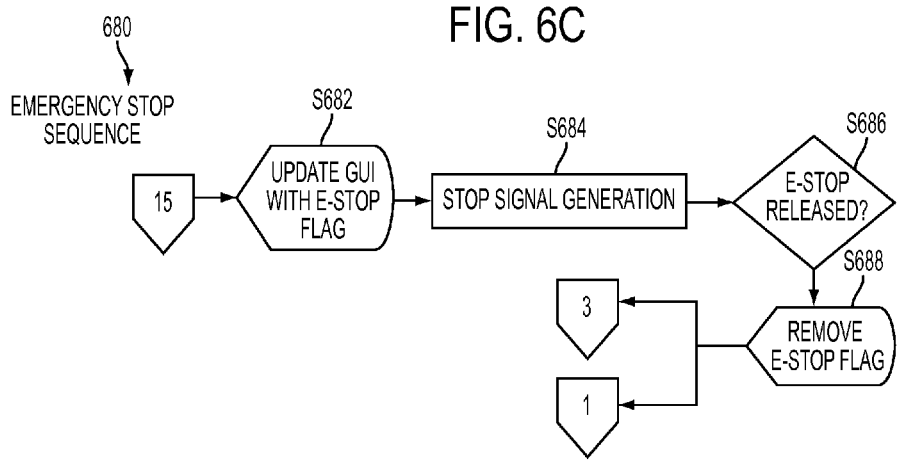

In an exemplary implementation shown in FIG. 6(D), an emergency stop sequence process (680) can be initiated at any time, using for example an emergency stop switch (408), to stop signal generation (S684), such as output (386) of FIG. 3(C). Emergency stop sequence process can also include updating GUI to indicated activation of the stop sequence (S682) and release of the stop sequence (S688). If the it is determined that the emergency stop has been released (S686), the system can proceed with appropriate operation process as describe next in more detail with reference to FIGS. 7 through 15.

Figure 7A:
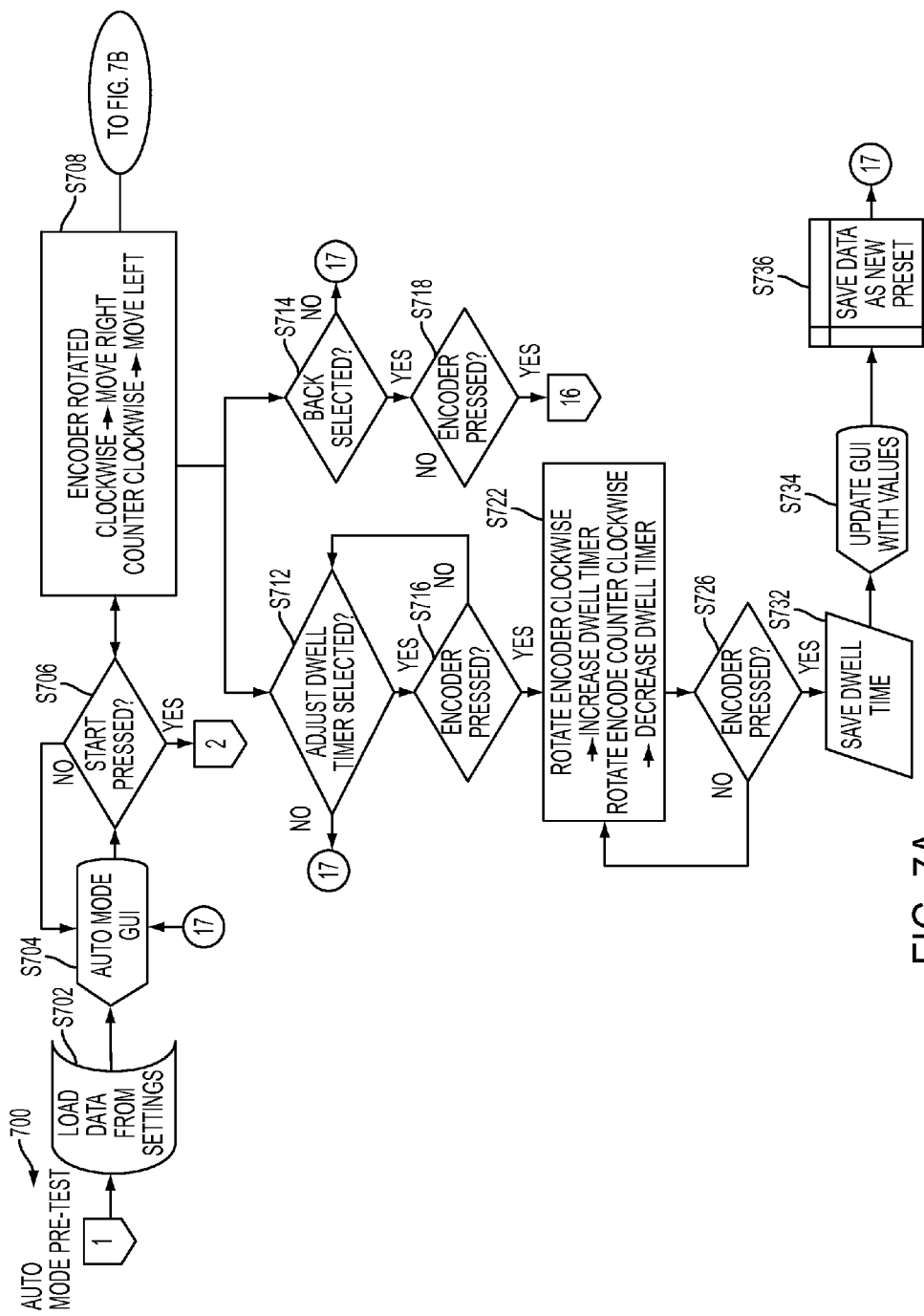
Figure 7B:
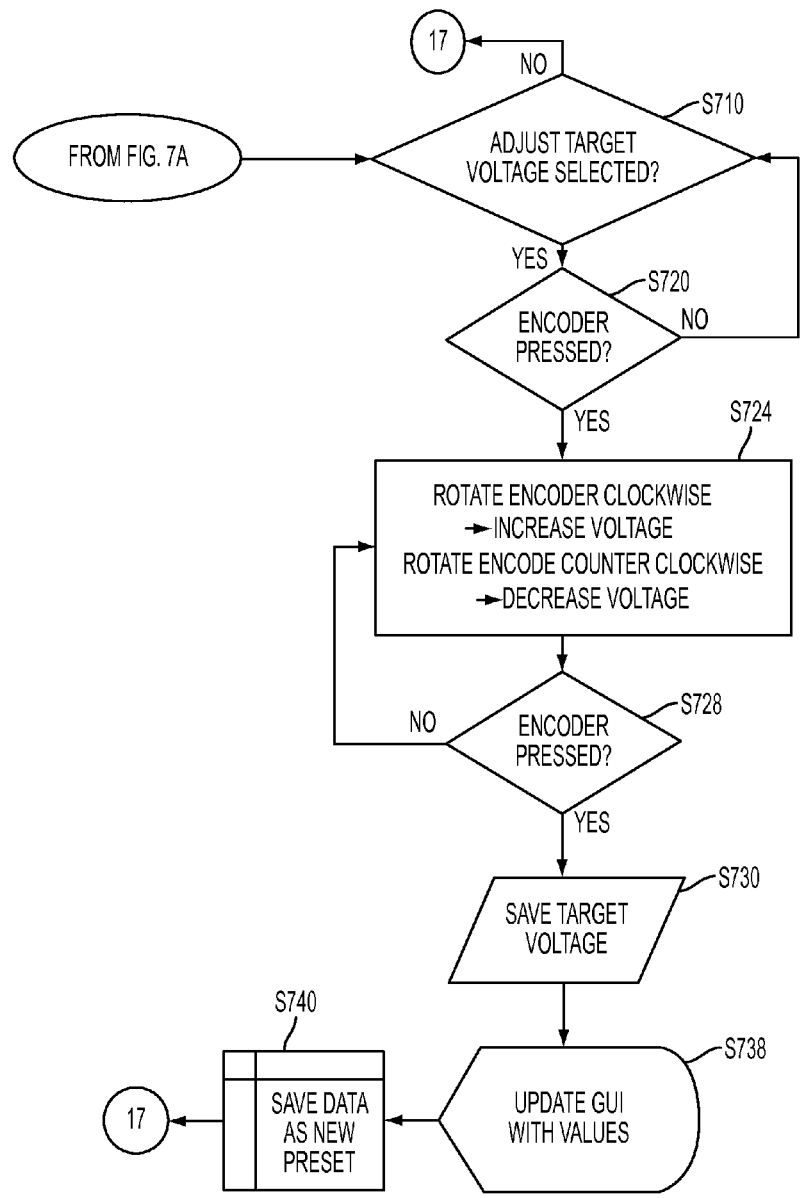

Referring to FIGS. 7(A)-7(B), auto mode pre-test process (700) can start when automatic (auto) mode is selected (S658) and initiated (S664) from the main screen process (650) as described above with reference to FIG. 6(C). Auto mode pre-test process (700) can include, for example, loading data from settings (S702) and displaying auto mode GUI (S704). Auto mode test sequence (800) descried below with reference to FIGS. 8(A)-8(B) can be initiated (S706) by pressing start switch (406). Various test parameters can be selected for adjusting, setting and saving as new presets by rotating encoder (404). For example, dwell time can be adjusted (S712), set or saved (S732) by rotating (S708, S722) and pressing (S716, S726) encoder (404). Then, GUI can be updated (S734) and adjusted dwell time saved as new preset (S736) accordingly. Likewise, for example, target voltage can be adjusted (S710), set or saved (S730) by rotating (S708, S724) and pressing (S720, S728) encoder (404). Then, GUI can be updated (S738) and adjusted target voltage saved as new preset (S740) accordingly. Process (700) can also allow to select a back step (S714), such that when back is not selected (S714), process returns to step (S704), and when back is selected (S714) and initialized (S918), process returns to main screen (650) at step (S652) and continues as described above with reference to FIG. 6(C).

Figure 8A:
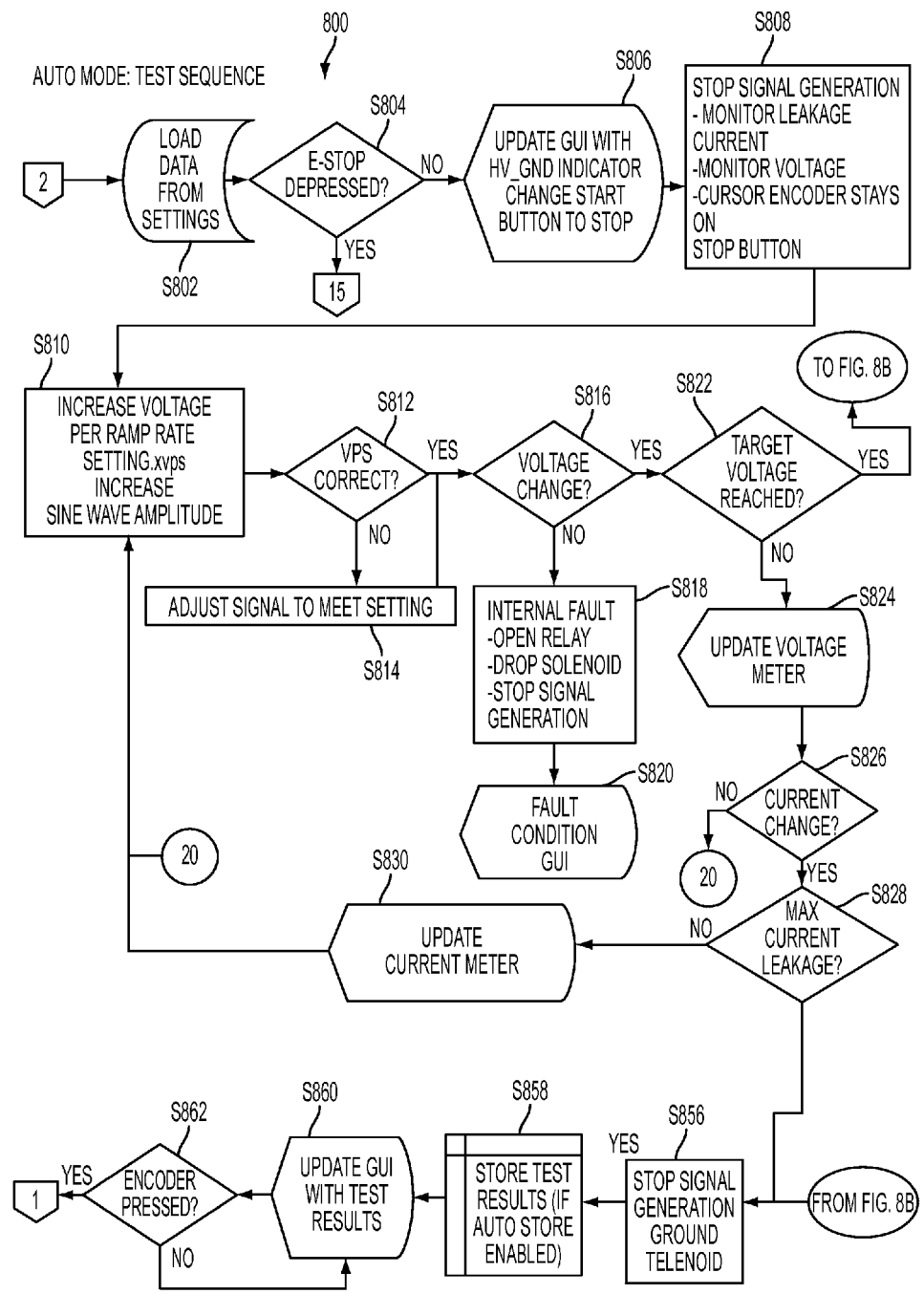
Figure 8B:
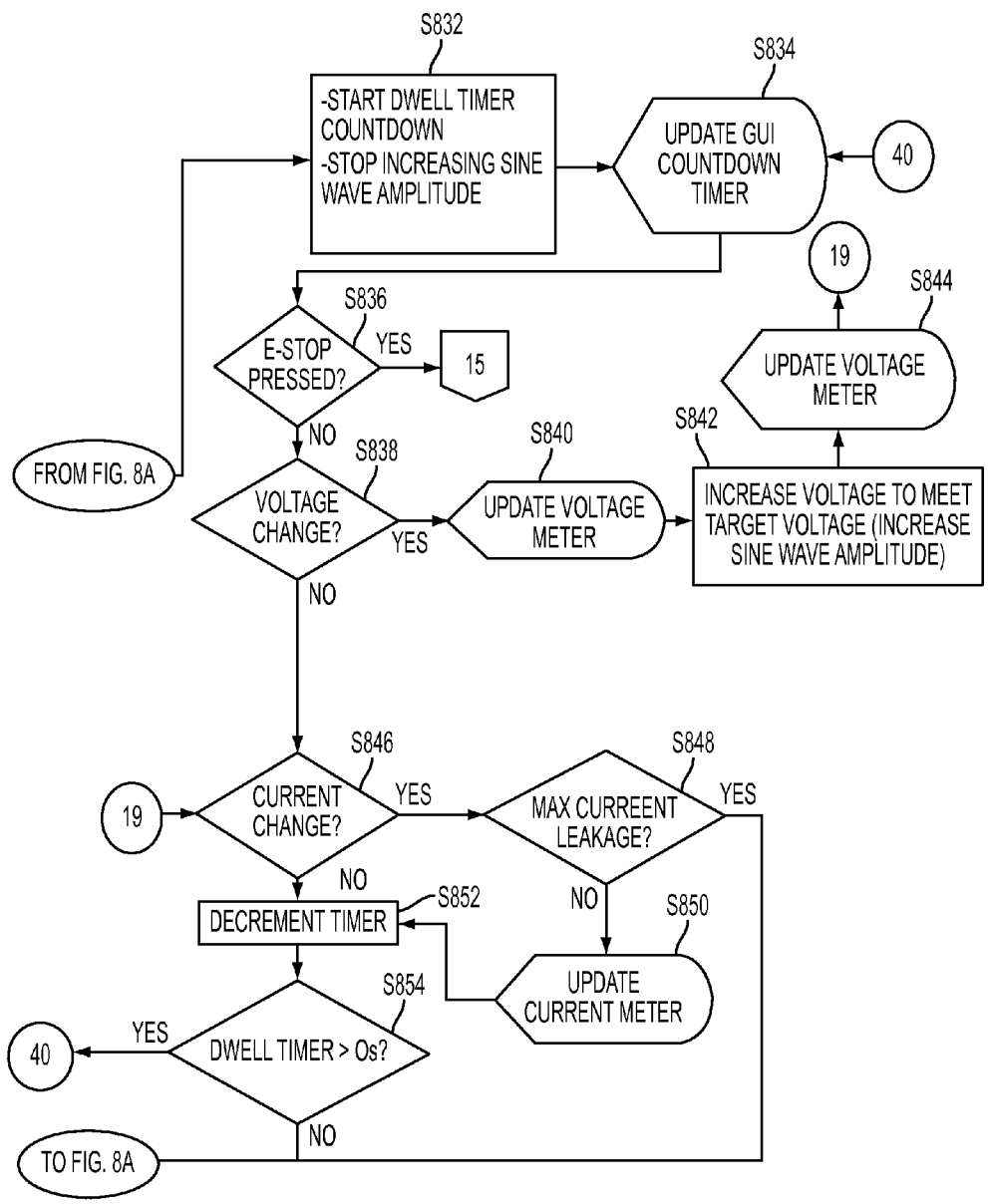

Referring to FIGS. 8(A)-8(B), auto mode test sequence process (800) can be initiated (S706) by pressing start switch (406) as described above with reference to FIGS. 7(A)-7(B). Auto mode test sequence process (800) can include, for example, loading data from settings (S802) and displaying updated auto mode test sequence GUI (S806), including, for example start switch (406) having an assigned stop function. In an exemplary implementation, emergency stop sequence (680) descried above with reference to FIG. 6(D) can be initiated (S804, S836) by pressing stop switch (408). In step (S808), the system starts signal generation, and leakage current and voltage monitoring. Voltage is increase based on ramp rate setting (the ramp rate can be, for example, volts per second (VPS)) where $X_{vps}$ increases sine wave amplitude (S810). If VPS is not correct (S812), the signal is adjusted to meet the setting (S814) until VPS is correct. When VPS is correct (S812) but voltage has not change (S816), an internal fault procedure (S818) is executed including, for example opening a relay connecting mains power to the system and stopping signal generation, and GUI is update (S820) to indicate a fault condition.

When VPS is correct (S812) and voltage has changed (S816), but target voltage has not been reached (S822) and current has not changed (S826) the process returns to step (S810). When VPS is correct (S812) and voltage has changed (S816), target voltage has not been reached (S822) and current has changed (S826), but maximum current leakage has not occurred (S828), the GUI is updated accordingly (S830) and process returns to step (S810). If maximum current leakage has occurred (S828), then signal generation is stopped and solenoid is grounded (S856), test results are stored (S858), GUI is updated with the test results (S860) accordingly, and system can return to auto mode pre-test process (700) if encoder is pressed (S862).

When target voltage has been reached (S822), the system stops increasing sine wave amplitude and starts dwell time countdown (S832) with the GUI updated accordingly (S834). If the voltage has not changed (S838), or has changed and then increased to meet target voltage (S842) with the GUI updated accordingly (S840, S844), and current has changed (S846) and maximum current leakage has occurred (S848), then signal generation is stopped and solenoid is grounded (S856), test results are stored (S858), GUI is updated with the test results (S860) accordingly, and system can return to auto mode pre-test process (700) if encoder is pressed (S862).

If current has not changed (S846), or has changed (S846) but maximum current leakage has not occurred (S848), timer is decremented (S852) with current meter updated accordingly (S850). If dwell timer is greater than zero (S854), then process returns to step (S834). If dwell timer is not greater than zero (S854), then signal generation is stopped and solenoid is grounded (S856), test results are stored (S858), GUI is updated with the test results (S860) accordingly, and system can return to auto mode pre-test process (700) if encoder is pressed (S862).

Figure 9A:
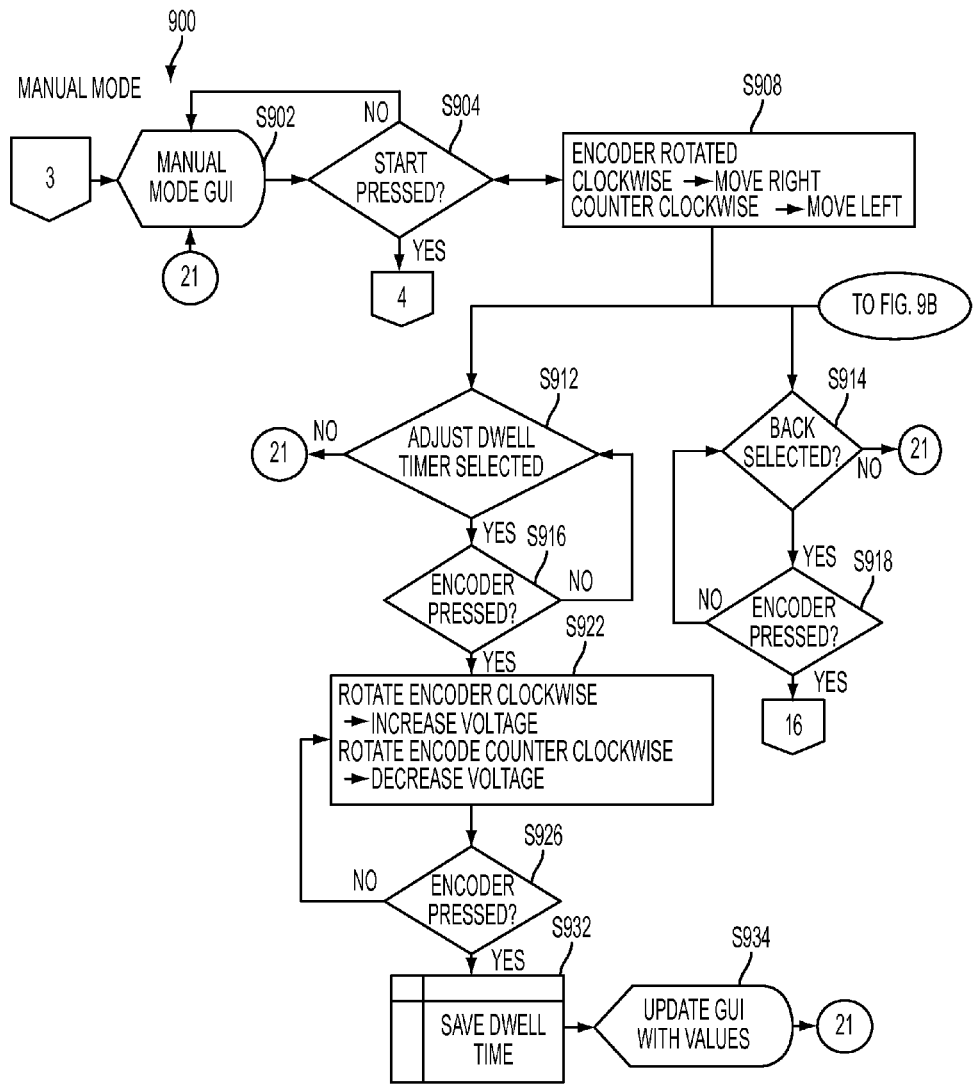
Figure 9B:
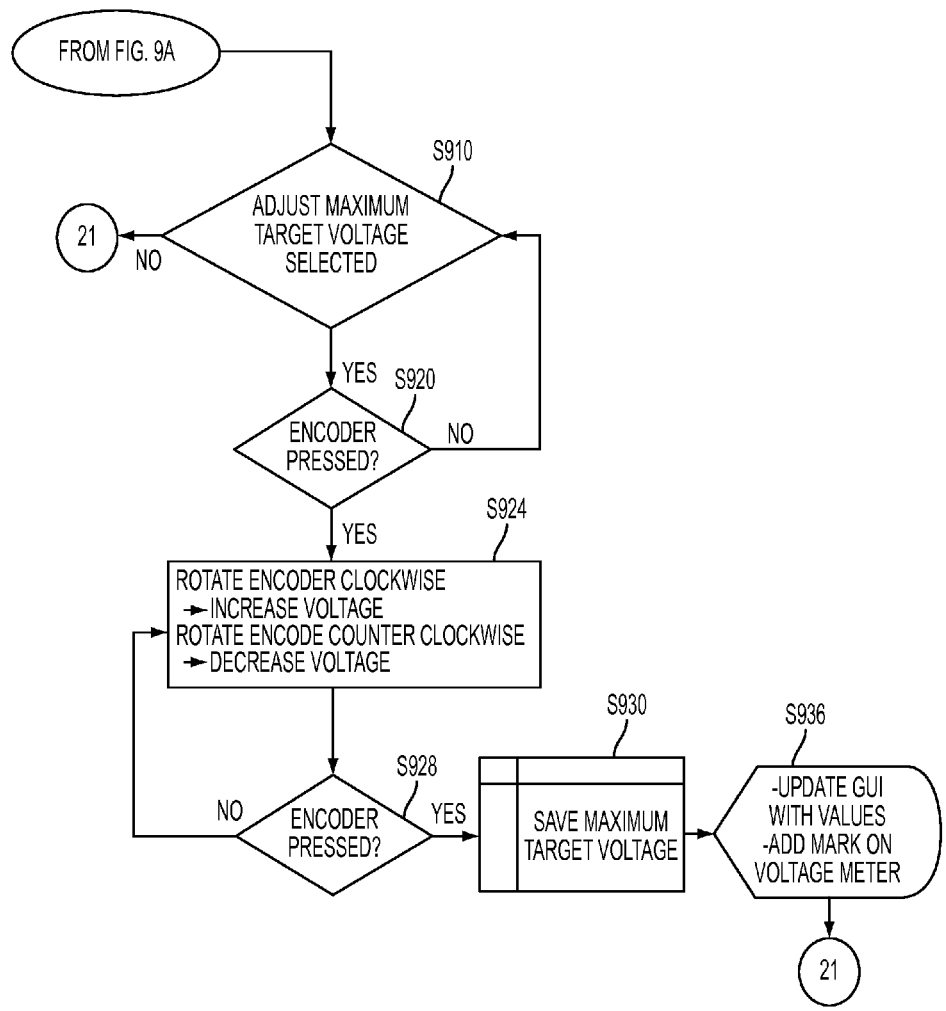

Referring to FIGS. 9(A)-9(B), manual mode process (900) can start when manual mode is selected (S656) and initiated (S662) from the main screen process (650) as described above with reference to FIG. 6(C). Manual mode process (900) starts, for example, by displaying manual mode GUI (S902). Manual mode run operation (1000) descried below with reference to FIGS. 10(A)-10(B) can be initiated (S904) by pressing start switch (406). As in the case of auto mode pre-test (700) described above, various test parameters can be selected for adjusting and saving by rotating encoder (404). For example, dwell time can be adjusted (S912) and saved (S932) by rotating (S908, S922) and pressing (S916, S926) encoder (404). Then, GUI can be updated (S734) accordingly. Likewise, for example, target voltage can be adjusted (S910) and saved (S930) by rotating (S908, S924) and pressing (S920, S928) encoder (404). Then, GUI can be updated (S936) accordingly. Process (S900) can also allow to select a back step (S914), such that when back is not selected (S914), process returns to step (S902), and when back is selected (S914) and initialized (S918), process returns to main screen (650) at step (S652) and continues as described above with reference to FIG. 6(C).

Figure 10A:
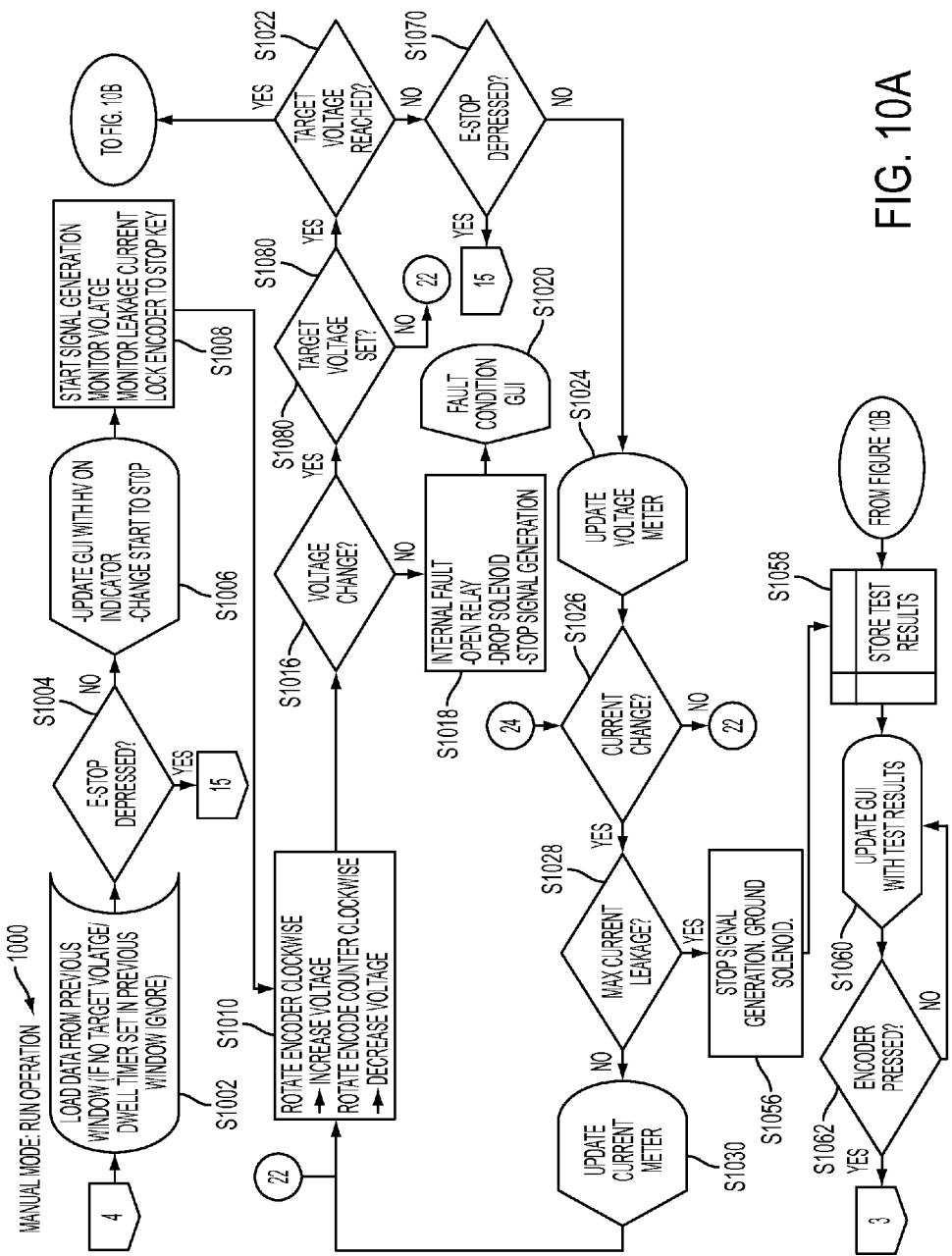
Figure 10B:
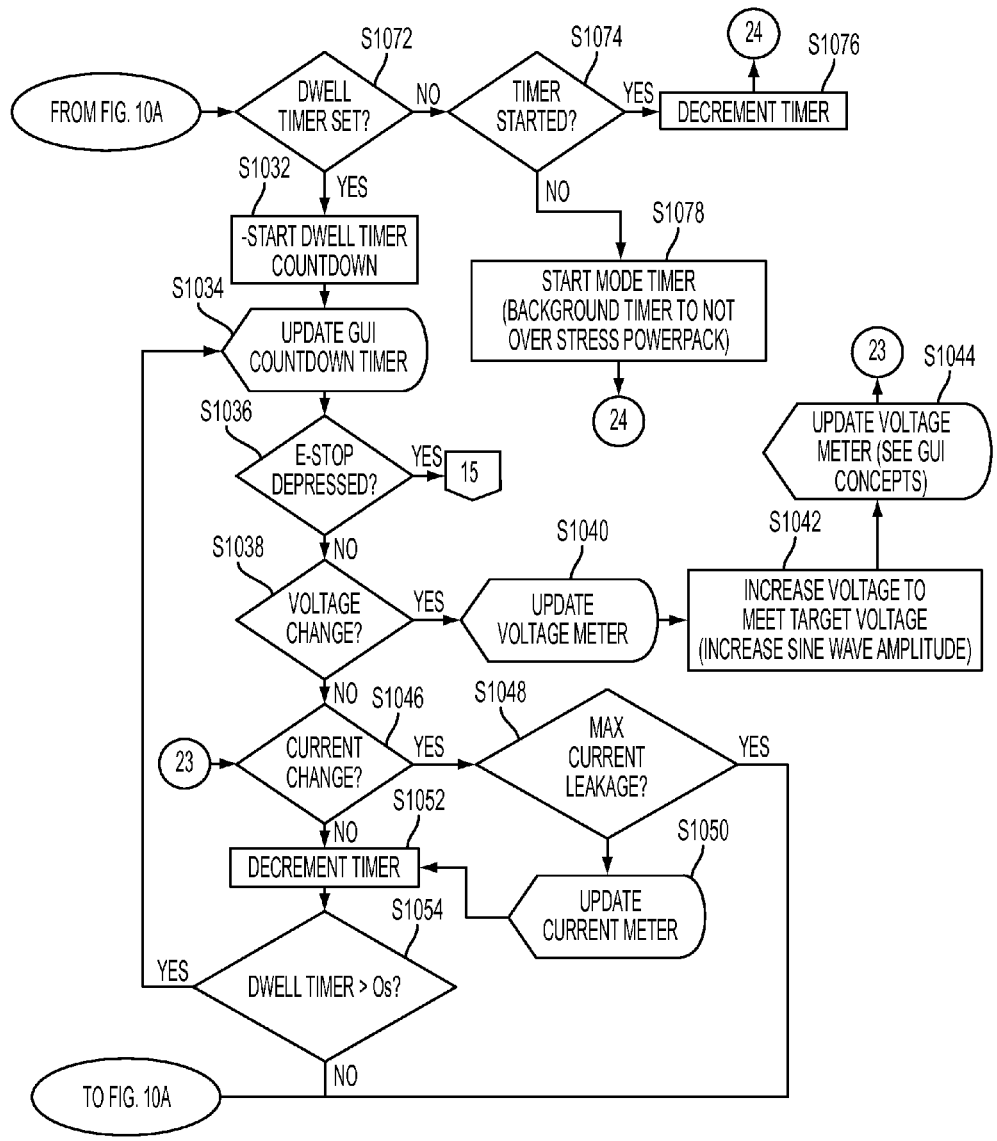

Referring to FIGS. 10(A)-10(B), manual mode run operation process (1000) can be initiated (S904) by pressing start switch (406) as described above with reference to FIGS. 9(A)-9(B). Manual mode run operation process (1000) can include, for example, loading data from previous settings (S1002) and displaying updated manual mode run operation GUI (S1006), including, for example high voltage ON indicator and switch (406) having an assigned stop function. In an exemplary implementation, emergency stop sequence (680) descried above with reference to FIG. 6(D) can be initiated (S1004, S1036, S1070) by pressing stop switch (408). In step (S1008), the system starts signal generation, and leakage current and voltage monitoring. Voltage is increase or decrease manually (S1010), for example using encoder (404). If voltage has not change (S1016), an internal fault procedure (S1018) is executed including, for example opening a relay connecting mains power to the system and stopping signal generation, and GUI is update (S1020) to indicate a fault condition.

When the voltage has changed (S1016) but target voltage has not been set (S1080) the process returns to manual adjustment step (S1010). When the voltage has changed (S1016) and target voltage has been set (S1080), but target voltage has not been reached (S1022) and current has not changed (S1026) the system returns to manual adjustment step (S1010). When the voltage has changed (S1016) and target voltage has been set (S1080), but target voltage has not been reached (S1022), and current has changed (S1026) but the maximum current leakage has not occurred (S1028), the GUI is updated accordingly (S1030) and process returns to step (S1010). If the maximum current leakage has occurred (S1028), then signal generation is stopped and solenoid is grounded (S1056), test results are stored (S1058), GUI is updated with the test results (S1060) accordingly, and system can return to manual mode process (900) if encoder is pressed (S1062).

When target voltage has been reached (S1022), but dwell timer is not set (S1072), the process checks if timer has started (S1074). If timer has started (S1074), time is decremented and process resumes at step (S1026). If timer has not started, the process starts mode timer (S1078) and resumes at step (S1026). When dwell timer is set (S1072), dwell timer countdown starts (S1032) with the GUI updated accordingly (S1034). If the voltage has not changed (S1038), or has changed and then increased to meet target voltage (S1042) with the GUI updated accordingly (S1040, S1044), and current has changed (S1046), and maximum current leakage has occurred (S1048), then signal generation is stopped and solenoid is grounded (S1056), test results are stored (S1058), GUI is updated with the test results (S1060) accordingly, and system can return to manual mode process (900) if encoder is pressed (S1062).

If current has not changed (S1046), or has changed (S1046) but maximum current leakage has not occurred (S1048), timer is decremented (S1052) with current meter updated accordingly (S1050). If dwell timer is greater than zero (S1054), then process returns to step (S1034). If dwell timer is not greater than zero (S1054), then signal generation is stopped and solenoid is grounded (S1056), test results are stored (S1058), GUI is updated with the test results (S1060) accordingly, and system can return to manual mode process (900) if encoder is pressed (S1062).

Figure 11:
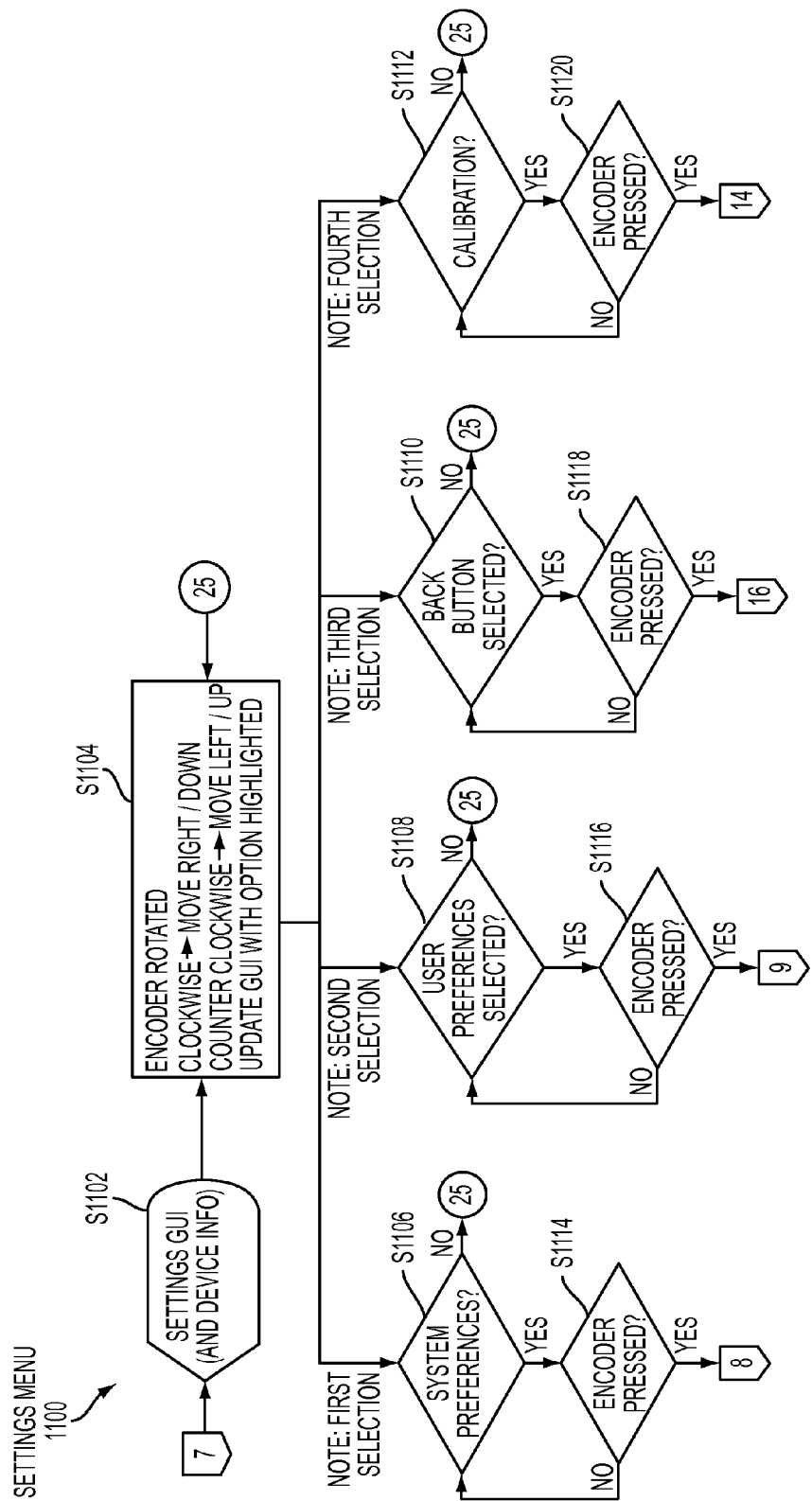

Referring to FIG. 11, settings menu process (1100) can start when setting menu is selected (S660) and initiated (S666) from the main screen process (650) as described above with reference to FIG. 6(C). Settings menu process (1100) starts, for example, by displaying settings menu GUI (S1102). When encoder (404) is rotated (S1104), the system checks for selection of system preferences settings (S1106), user preferences setting (S1108), or calibration (S1112), and then if the encoder is pressed (S1114), (S1116) or (S1120) an operational process associated with the corresponding selected settings mode is initiated, as described below with reference to FIGS. 12 through 17(A)-17(B). Process (1100) can also allow to select a back step (S1110), such that when back is not selected (S1110), process continues with step (S1104), and when back is selected (S1110) and initialized (S1108), process returns to main screen (650) at step (S652) and continues as described above with reference to FIG. 6(C).

Figure 12:
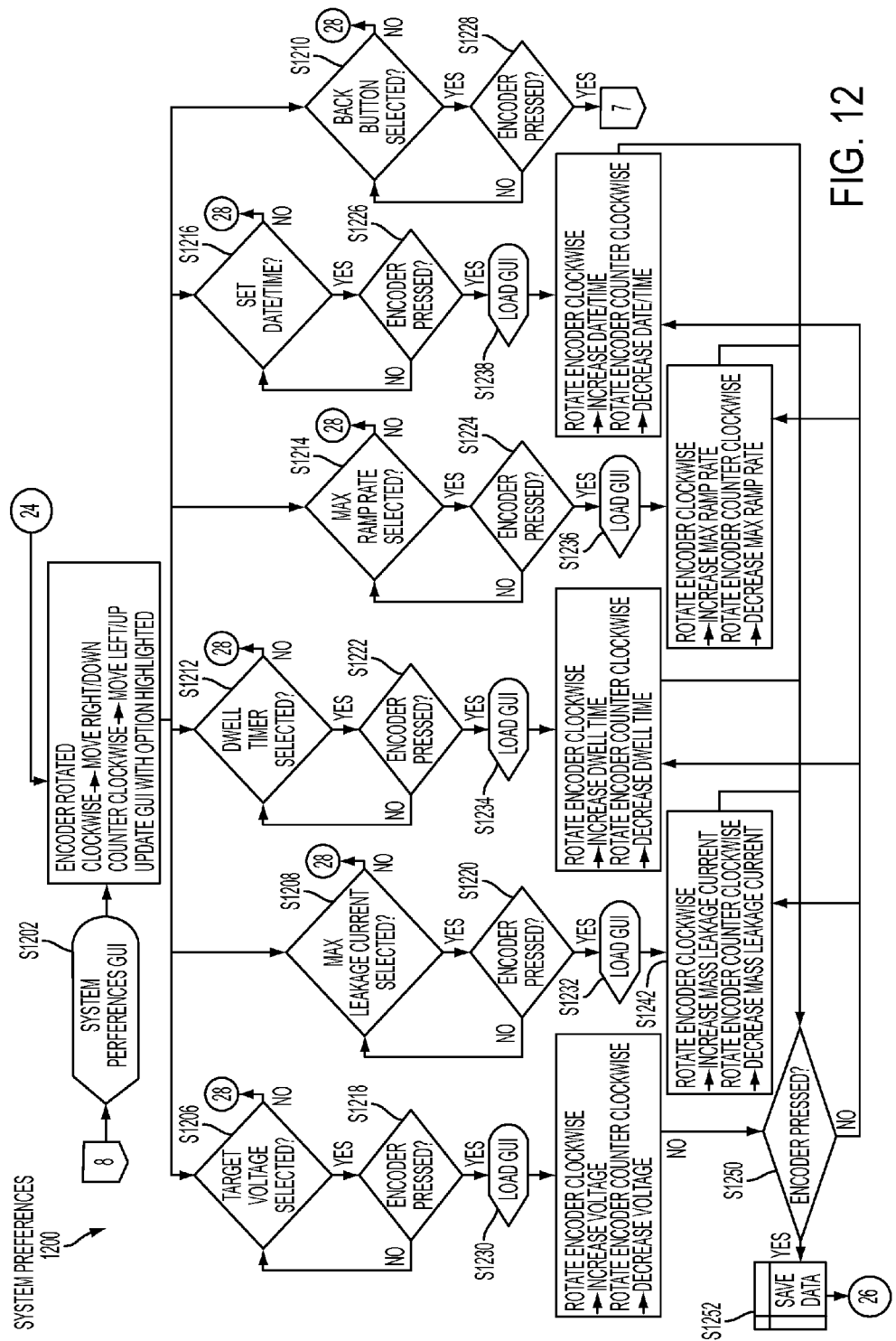

Referring to FIG. 12, system preferences process (1200) can start when system preferences is selected (S1106) and initiated (S1114) from the settings menu process (1100) as described above with reference to FIG. 11. System preferences process (1200) starts, for example, by displaying system preferences GUI (S1202). When encoder (404) is rotated (S1204), the process checks for selection of target voltage (S1206), max leakage current (S1208), dwell timer (S1212), max ramp rate (S1214), or set date/time (S1216) preference, and then if the encoder is pressed (S1218), (S1220), (S1222), (S1224) or (S1226), appropriate GUI (S1230), (S1232), (S1234), (S1236), or (S1238) is loaded allowing modification (S1240), (S1242), (S1244), (S1246), or (S1248) and setting (S1250) of system preferences by encoder (404). These set system preferences can then be saved (S1252) and process can return to step (S1204). Process (1200) can also allow to select a back step (S1210), such that when back is not selected (S1210), process continues with step (S1204), and when back is selected (S1210) and initialized (S1228), process returns to settings menu (1100) at step (S1102) and continues as described above with reference to FIG. 11.

Figure 13:
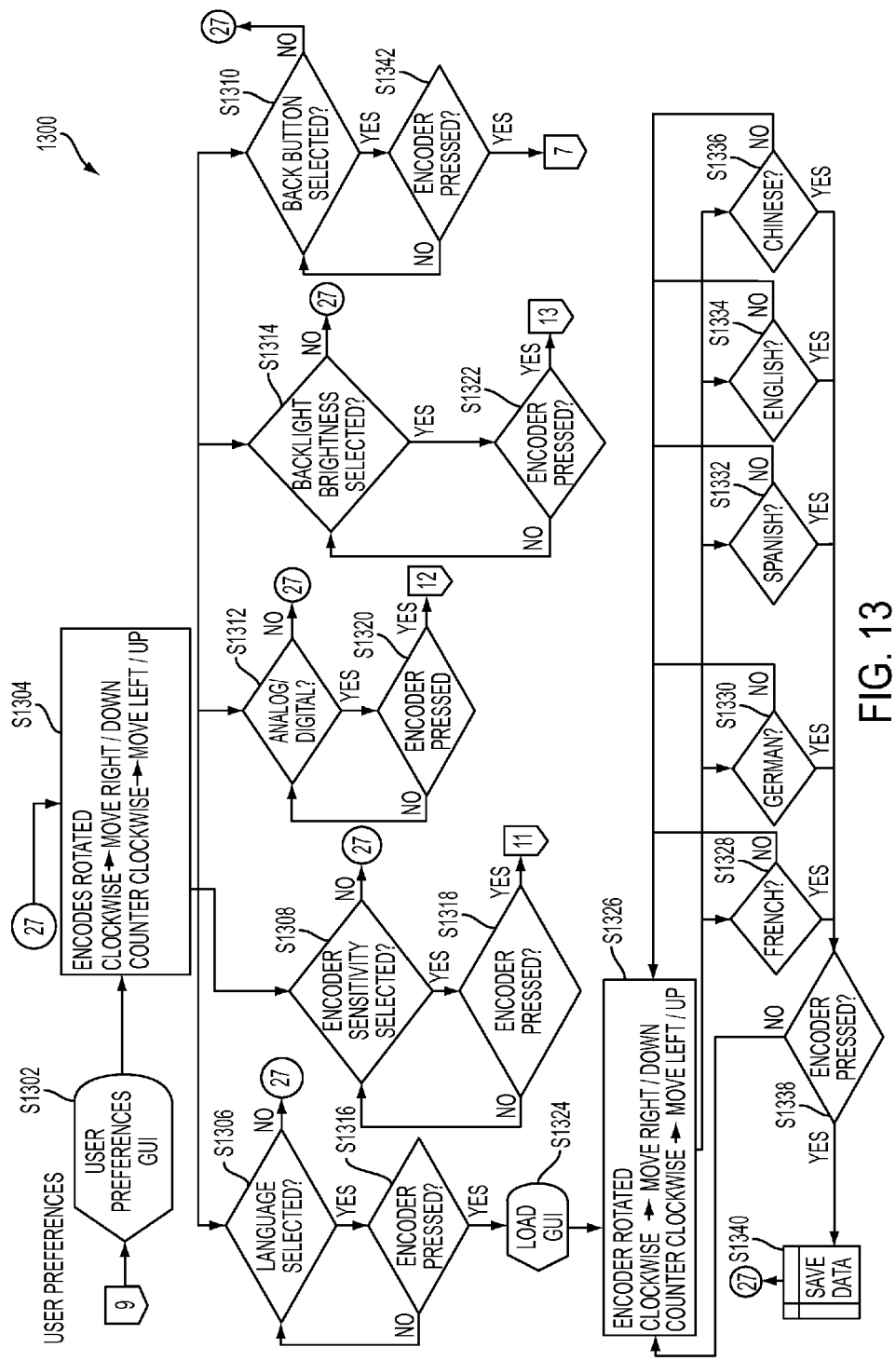

Referring to FIG. 13, user preferences process (1300) can start when user preferences is selected (S1108) and initiated (S1116) from the settings menu process (1100) as described above with reference to FIG. 11. User preferences process (1300) starts, for example, by displaying user preferences GUI (S1302). When encoder (404) is rotated (S1304), the system checks for selection of language (S1306), encoder sensitivity (S1308), analog/digital (S1312), or backlight brightness (S1314) preference, and then if the encoder is pressed (S1316), (S1318), (S1320), or (S1222). If language preference is selected (S1306) and encoder is pressed (S1366), appropriate GUI (S1324) is loaded, so that rotation (S1326) of encoder (404) selects language preference (S1328), (S1330), (S1332), (S1334), or (S1336), and pressing (S1338) of encoder (404) saves the selected language preference (S1340). Then, process can return to step (S1304). If encoder sensitivity (S1308), analog/digital (S1312), or backlight brightness (S1314) preference is selected and the encoder is pressed (S1318), (S1320), or (S1222), an operational process for setting the corresponding selected preference is initiated, as described below with reference to FIGS. 14 through 16. Process (1300) can also allow to select a back step (S1310), such that when back is not selected (S1310), process continues with step (S1304), and when back is selected (S1310) and initialized (S1342), process returns to settings menu (1100) at step (S1102) and continues as described above with reference to FIG. 11.

Referring to FIG. 14, encoder sensitivity setting process (1400) can start when encoder sensitivity is selected (S1308) and initiated (S1318) from the user preferences process (1300) as described above with reference to FIG. 13. Encoder sensitivity setting process (1400) starts, for example, by loading previous data (S1410) and displaying updated GUI (S1402), so that rotation (S1404) of encoder (404) modifies encoder sensitivity, and pressing (S1406) of encoder (404) saves the modified encoder sensitivity (S1408). The process then returns to user preferences (1300) at step (S1302) and continues as described above with reference to FIG. 13.

Referring to FIG. 15, analog/digital meter option setting process (1500) can start when analog/digital meter option is selected (S1312) and initiated (S1320) from the user preferences process (1300) as described above with reference to FIG. 13. Analog/digital meter option setting process (1500) starts, for example, by displaying updated GUI (S1502), so that rotation (S1504) of encoder (404) allows for selection of analog (S1510) or digital (S1412) option, and pressing (S1506) or (S1416) of encoder (404) saves the selected analog (S1508) or digital (S1518) option. The process then returns to user preferences (1300) at step (S1302) and continues as described above with reference to FIG. 13.

Referring to FIG. 16, backlight brightness setting process (1600) can start when backlight brightness is selected (S1314) and initiated (S1322) from the user preferences process (1300) as described above with reference to FIG. 13. Backlight brightness setting process (1600) starts, for example, by loading previous data (S1610) and displaying updated GUI (S1602), so that rotation (S1604) of encoder (404) modifies backlight brightness, and pressing (S1606) of encoder (404) saves the modified backlight brightness (S1608). The process then returns to user preferences (1300) at step (S1302) and continues as described above with reference to FIG. 13.

Figure 17A:
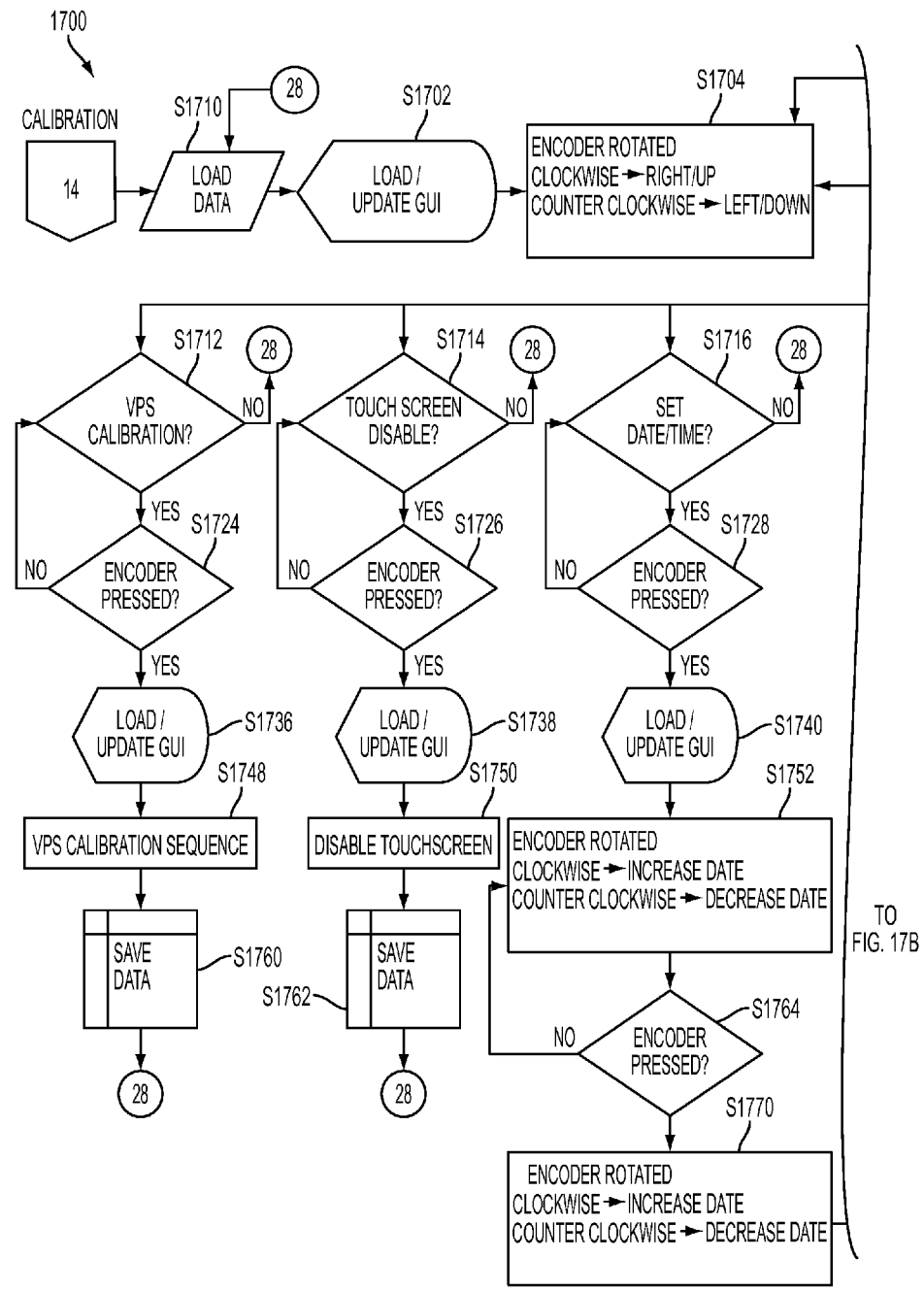
Figure 17B:
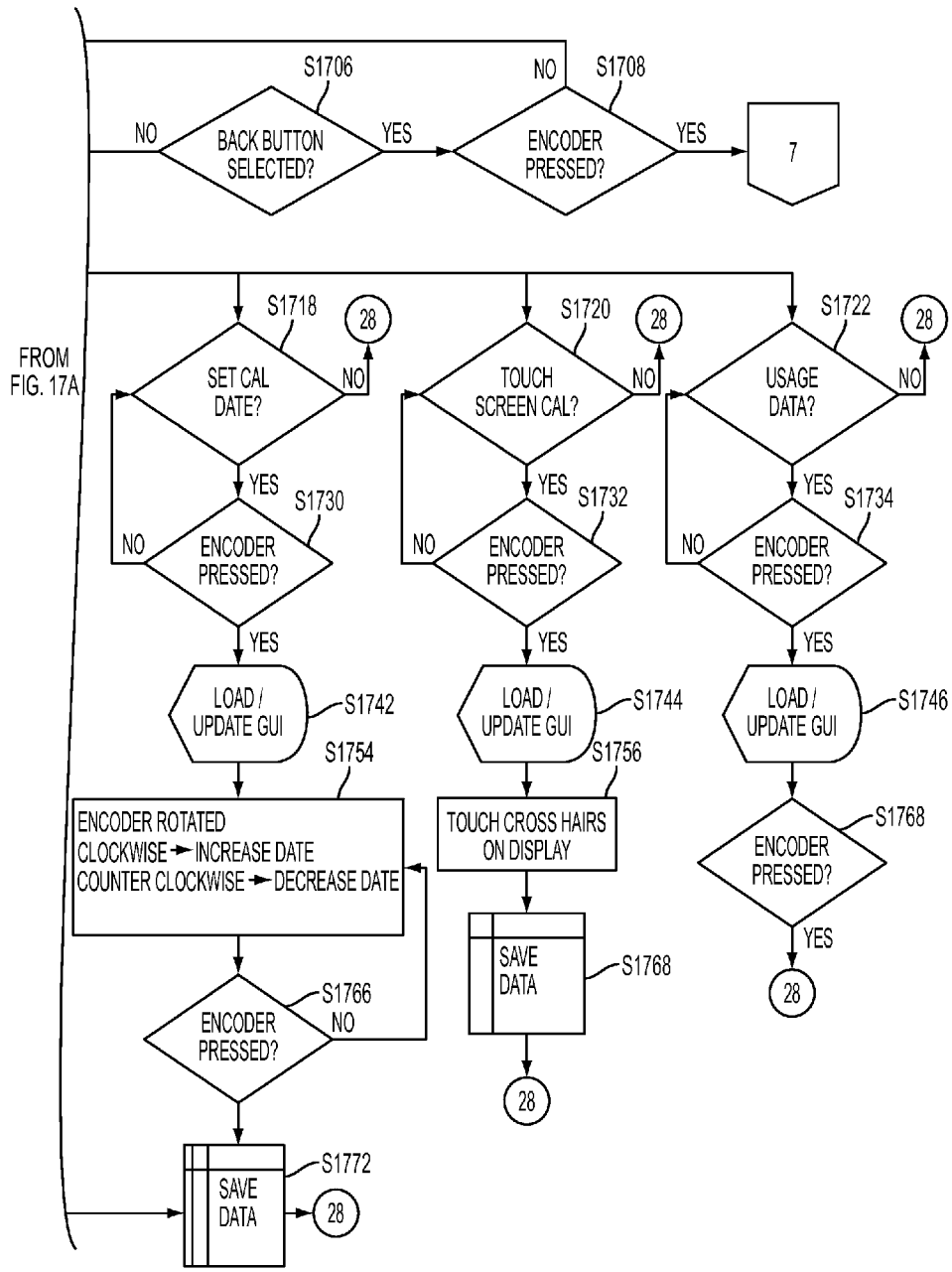

Referring to FIGS. 17(A)-17(B), calibration process (1700) can start when calibration is selected (S1112) and initiated (S1120) from the settings menu process (1100) as described above with reference to FIG. 11. Calibration process (1700) starts, for example, by loading previous data (S1710) and displaying updated GUI (S1702). When encoder (404) is rotated (S1704), the process checks for selection of VPS calibration (S1712), touchscreen disable (S1714), date/time set (S1716), calibration date set (S1718), touchscreen calibration (S1720), or usage data (S1722) option, and then if the encoder is pressed (S1724), (S1726), (S1728), (S1730), (S1732) or (S1734), loads appropriate GUI (S1736), (S1738), (S1740), (S1742), (S1744) or (S1746) for the selected option.

For VPS calibration option, loading of appropriate GUI (S1736) is followed by VP calibration sequence (S1748) with resulting data saved (S1760), whereupon process can return to step (S1710). For touchscreen disable option, loading of appropriate GUI (S1738) is followed by touchscreen disable (S1750) with resulting data saved (S1766), whereupon process can return to step (S1710). For set date/time option, loading of appropriate GUI (S1740) allows rotation (S1752) of encoder (404) to modify date/time, and pressing (S1764) of encoder (404) to allow rotation (S1770) of encoder (404) to further modify date/time with resulting data saved (S1772), whereupon process can return to step (S1710). For set calibration date option, loading of appropriate GUI (S1742) allows rotation (S1754) of encoder (404) to modify calibration date and pressing (S1766) of encoder (404) with resulting data saved (S1772), whereupon process can return to step (S1710). For touchscreen calibration option, loading of appropriate GUI (S1744) includes, for example providing calibration cross hairs on touchscreen display, and performing calibration based on touch of cross hairs on display (S1756) with resulting data saved (S1768), whereupon process can return to step (S1710). For usage data option, loading of appropriate GUI (S1746) allows updating of the usage data by again pressing (S1758) of encoder (404) whereupon process can return to step (S1710).

Process (1700) can also allow selection of a back step (S1706), such that when back is not selected (S1706), process continues with step (S1704), and when back is selected (S1706) and initialized (S1708), process returns to settings menu (1100) at step (S1102) and continues as described above with reference to FIG. 11.

Figure 18A:
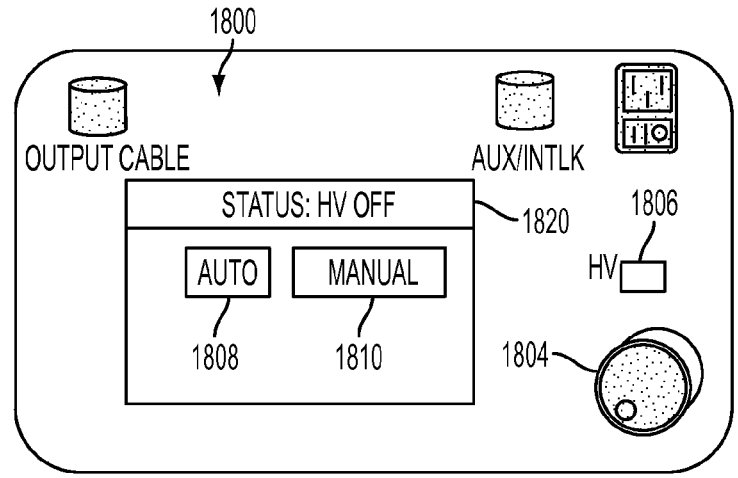
FIGS. 18(A)-18(C) illustrate examples of user interface and process flows for systems according to exemplary embodiments of the present invention.
Figure 18B:
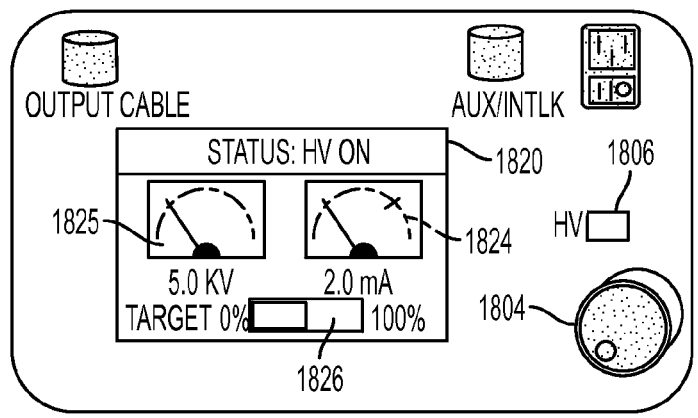
Figure 18C:
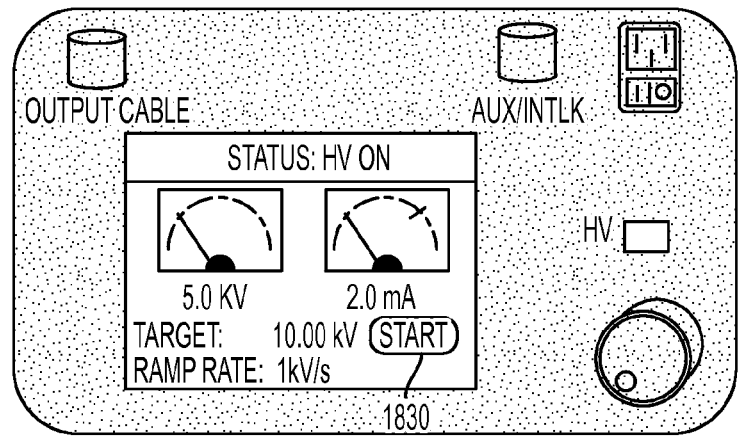
Figure 19:
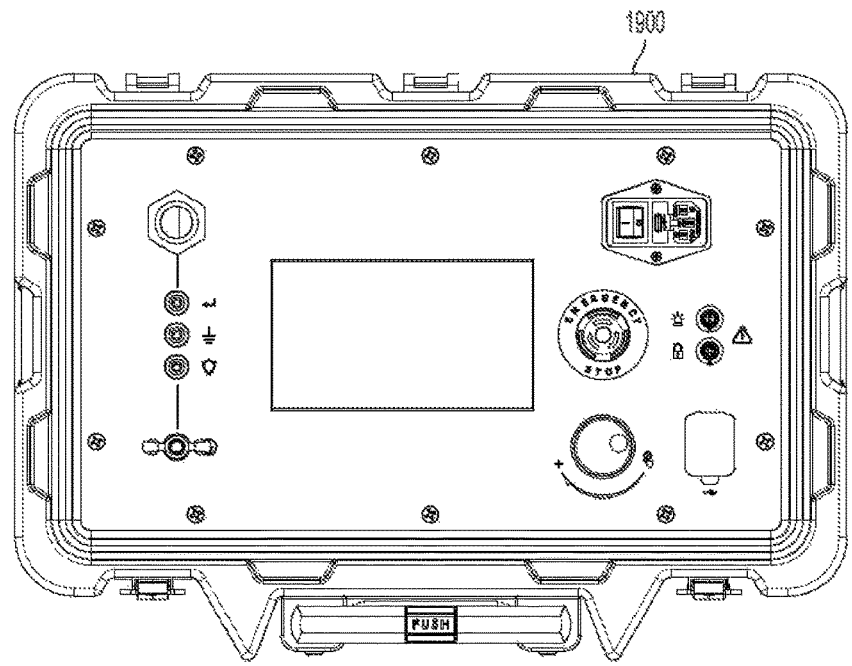
FIGS. 19 and 20 illustrate additional examples of an enclosure containing a system according to an exemplary embodiment of the present invention.
Figure 20:
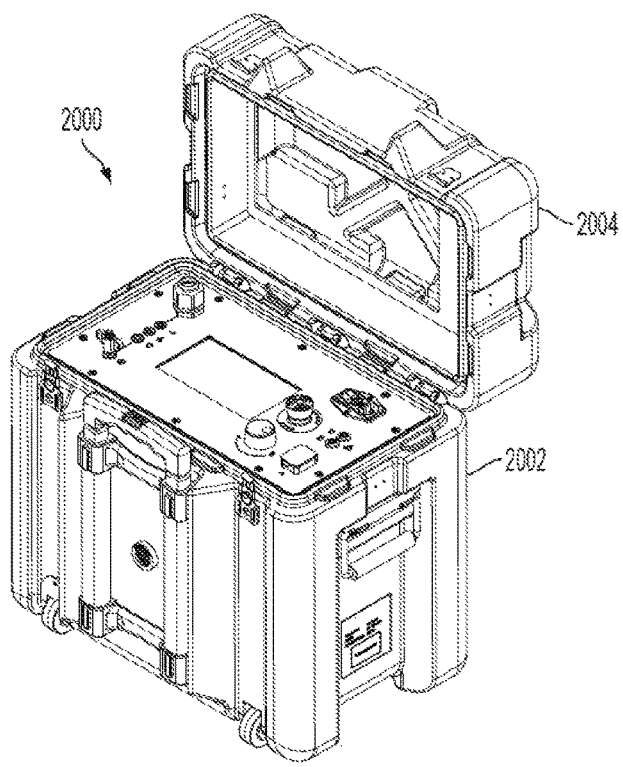

As illustrated in the examples of FIGS. 18(A)-18(B), 19 and 20, systems according to exemplary embodiments of the present invention include a control panel (1800) configured to provide control and information display for processes described above with reference to FIGS. 5 through 17(A)-17(B). For example, FIG. 18(A) shows a display (1802) allowing system operators to choose automatic (1808) or manual (1810) mode of operation using encoder (1804) as described above with reference to FIGS. 5 through 17(A)-17(B). Example of FIG. 18(B) shows a display (1802) providing visual analog display of voltage (1822) and current (1824) levels, as well as a status indication (1826) of current voltage and/or current as a percentage of target voltage and/or current. Further example of FIG. 18(C) shows display (1802) providing a visual indication of target voltage having been reached, and a start (1830) option allowing start of test by press of switch (1806) or by action of encoder (1804). According to an exemplary implementation, graphical display can be configured, or set up by a user, to provide a visual indication of a high voltage state by, for example, a color change of display ribbon (1820). FIG. 19 illustrates a top view of an exemplary system enclosure (1900) containing control panel (1800). FIG. 20 illustrates a three-dimension view of an exemplary system enclosure (2000) including panel (1800) provided in housing (2002), and having a lid (2004) providing a sealed closure for system components when closed.

Figure 21A:
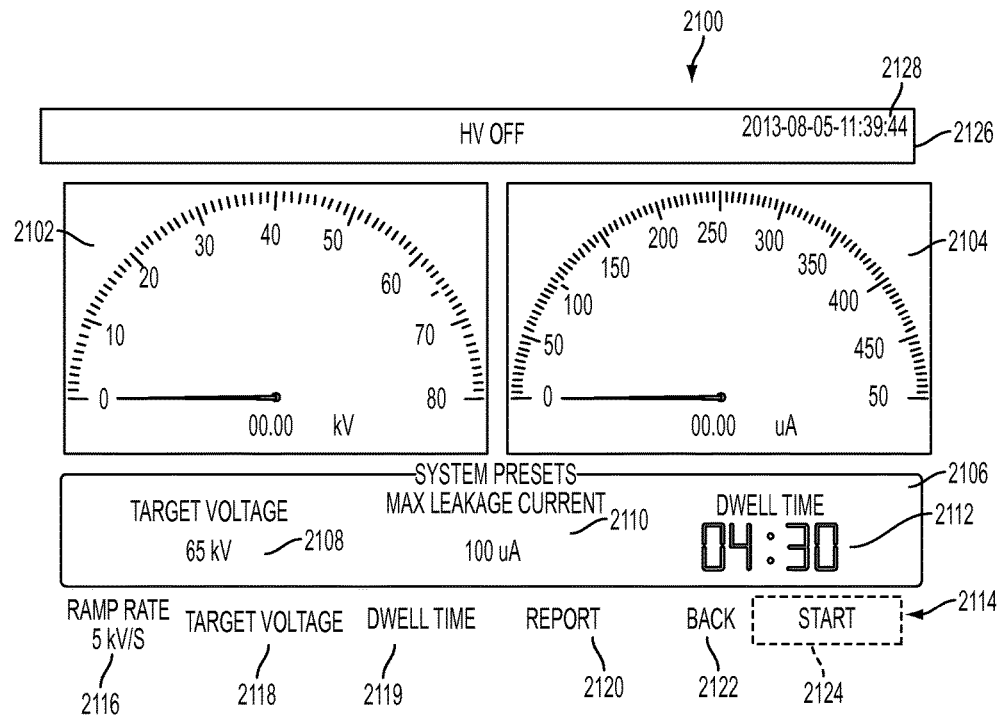
FIGS. 21(A) and 21(B) illustrate examples of graphical display output for systems and methods according to exemplary embodiments of the present invention.
Figure 21B:
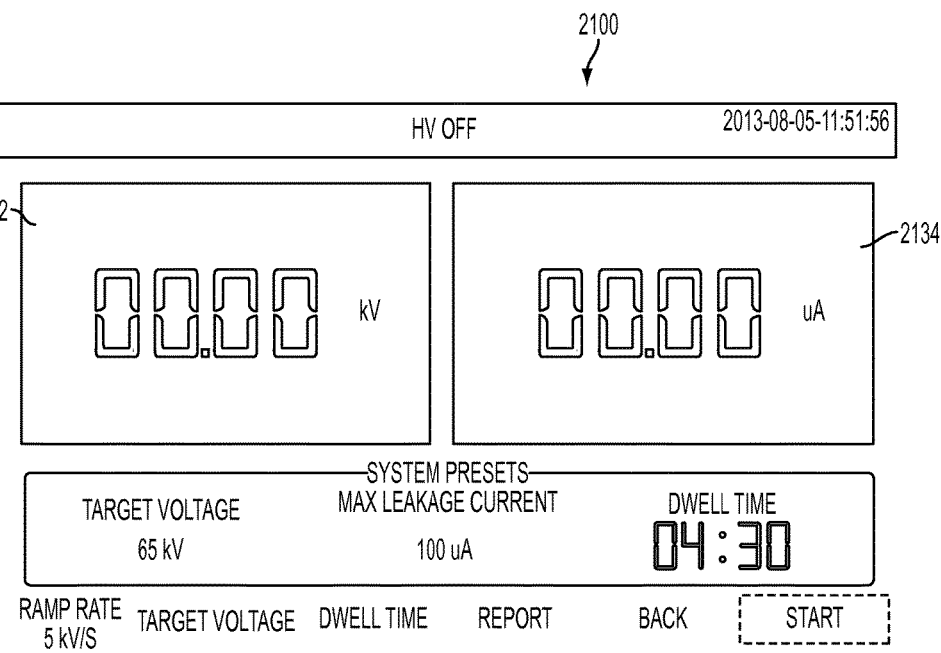

Referring to FIGS. 21(A) and 21(B), graphical display (2100) according to an exemplary embodiment of the present invention can provide real time information such as voltage (2102, 2122) and current (2104, 2124) readings, as well as system parameters (2106) including without limitation target voltage (2108), maximum leakage current (1210), and dwell time (2120). Display (2100) can also be configured to provide user selectable control options (2114) such as, without limitation, voltage ramp rate (2116), target voltage (2118), dwell time (2119), report (2120) and back (2122) commands, and start (2124). Graphical display (2100) can output voltage and current in user-selectable analog (2102, 2104) or digital (2132, 2134) format. A detailed description of exemplary underlying processes as illustrated in graphical displays of FIGS. 21(A) and 21(B) are provided above with reference to FIGS. 5 through 17(A)-17(B).

The above-described exemplary embodiments may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. The media may also be a transmission medium such as optical or metallic lines, wave guides, and so on, including a carrier wave transmitting signals specifying the program instructions, data structures, and so on. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention.

While the present invention has been shown and described with reference to certain exemplary embodiments thereof, it will be understood by those skilled in the art that various changes in form and details may be made therein without departing from the spirit and scope of the present invention as defined by the appended representative claims.

I claim:

1. A test system comprising:
a driver circuit receiving a control signal and a first voltage signal, and outputting a second voltage signal based on the received control signal, said second voltage signal having a greater amplitude than said first voltage signal;
an amplification circuit receiving the second voltage signal and amplifying the second voltage signal to output a high voltage signal;
a controller outputting the control signal to the driver circuit, the controller receiving a first feedback signal from an output of said amplification circuit comprising at least one first characteristic of the high voltage signal, and the controller receiving a second feedback signal from an output of said driver circuit comprising at least one second characteristic of the second voltage signal, the controller selectively modifying the control signal based on at least one of the first and second feedback signals to control at least the second voltage signal output from the driver circuit;
an interface for selective activation of automatic or manual operating mode, and selective entry or modification of a first information; and
a control interface in communication with the interface, the control interface selectively transmitting the first information to the controller, and selectively transmitting second information comprising the least one of the first and second feedback signals to the interface,
wherein
when the automatic operating mode is selectively activated, the controller autonomously modifies the control signal based on the at least one of the control parameters with reference to the at least one of the first and second feedback signals, and
when the manual operating mode is selectively activated, the controller selectively modifies the control signal based on at least one of the first information, the first feedback signal, and the second feedback signal.

2. The test system of claim 1, wherein:
the system further comprises a power supply receiving an alternating current (AC) voltage from AC mains and outputting the first voltage to the driver circuit,
the driver circuit comprises a pulse width modulation (PWM) amplifier receiving the first voltage from the power supply and receiving the control signal from the controller, the control signal comprising a low voltage input signal, and
the driver circuit outputs the second voltage signal comprising a PWM dependent AC signal.

3. The test system of claim 1, wherein:
the driver circuit receives the first voltage signal comprising an alternating current (AC) voltage from AC mains,
the driver circuit comprises an AC driver circuit receiving the first voltage signal and receiving the control signal from the controller, the control signal comprising an AC input control signal,
the driver outputting the second voltage signal comprising an AC signal dependent on the AC input control signal.

4. The system of claim 1 wherein the controller comprises a programmable microprocessor for selectively controlling the control signal output to the driver circuit and analyzing the least one of the first and second feedback signals according to a set of computer executable instructions.

5. The system of claim 4, wherein the instructions are stored on non-transient computer readable medium internal or external to the microprocessor, and the instructions are selectively accessible by the microprocessor via at least one of a wired and wireless communication.

6. The system of claim 1, wherein the controller selectively receives the first information comprising at least one control parameter from the control interface, and selectively transmits the second information comprising the least one of the first and second feedback signals to the control interface.

7. The system of claim 6, further comprising:
a user interface for selectively inputting the first information; and
a display providing user accessible output indicative of the least one of the first and second feedback signals.

8. The system of claim 1, wherein the controller autonomously modifies the control signal based on at least one of preset and variable autonomous control parameters with reference to the least one of the first and second feedback signals.

9. The system of claim 8, wherein the autonomous control parameters are communicated to the controller via at least one of an internal user interface and an external user interface, using at least one of a wired communication and a wireless communication.

10. The system of claim 1, further comprising:
a user interface comprising a first user input for selective activation of the automatic or manual operating mode, and a second user input for selective entry or modification of the first information, the first information comprising at least one control parameter; and
a memory storing the at least one control parameter.

11. A test system comprising:
a driver circuit receiving a control signal and a first voltage signal, and outputting a second voltage signal based on the received control signal, said second voltage signal having a greater amplitude than said first voltage signal;
an amplification circuit receiving the second voltage signal and amplifying the second voltage signal to output a high voltage signal; and
a controller outputting the control signal to the driver circuit, the controller receiving a first feedback signal from an output of said amplification circuit comprising at least one first characteristic of the high voltage signal, and the controller receiving a second feedback signal from an output of said driver circuit comprising at least one second characteristic of the second voltage signal,
the controller selectively modifying the control signal based on at least one of the first and second feedback signals to control at least the second voltage signal output from the driver circuit,
wherein the controller comprises:
a user interface for selective entry or modification of a first information comprising at least one control parameter;
a memory storing the at least one control parameter; and
a programmable microprocessor outputting the control signal to the driver circuit; and
at least one interface to the microprocessor providing to the microprocessor at least one of the first feedback signal, and the second feedback signal,
wherein the microprocessor selectively modifies the control signal based on the at least one control parameter, stored in the memory or received from the user interface, and the at least one of the first and second feedback signals, to control at least the second voltage signal output from the driver circuit.

12. The system of claim 11, wherein the microprocessor receives the at least one of the first and second feedback signals and selectively modifies the control signal based thereon essentially in real time.

13. The system of claim 11 further comprising a control interface, wherein the microprocessor selectively receives the first information from the control interface, and selectively transmits a second information comprising the least one of the first and second feedback signals to the control interface.

14. The system of claim 13 wherein the control interface comprises at least one of a wired or wireless communication interfaces for transmitting, receiving, or transmitting and receiving at least one of the first and second information.

15. The system of claim 14, wherein the driver circuit comprises a pulse width modulation (PWM) amplifier receiving the control signal caused by the microprocessor, and the control signal comprising a low voltage signal.

16. The system of claim 14, wherein the driver circuit comprises an AC driver circuit receiving the control signal caused by the microprocessor, the control signal comprising an AC input control signal.

17. The system of claim 15, wherein the microprocessor is configured to adjust the low voltage control signal based on output from the control interface.

18. The system of claim 11, wherein the microprocessor autonomously performs the selective modification of the control signal based on the at least one control parameter stored in the memory, with reference to the at least one of the first and second feedback signals.

19. The system of claim 11, wherein the microprocessor autonomously performs the selective modification of the control signal based on the first information received via the user interface, with reference to the at least one of the first and second feedback signals.

20. The system of claim 8, wherein the controller autonomously modifies the control signal in a test sequence selectively accessing the at least one of preset and variable autonomous control parameters.

21. The system of claim 20, wherein at least a portion of the test sequence is selectively communicated to the controller via at least one of an internal user interface and an external user interface, using at least one of a wired communication and a wireless communication.

22. The system of claim 11, wherein microprocessor autonomously performs the selective modification of the control signal in a test sequence selectively accessing the at least one control parameter.

23. The system of claim 22, wherein at least a portion of the test sequence is selectively communicated to the microprocessor via the user interface.

24. The system of claim 1, wherein the controller selectively modifies the control signal based on the first and second feedback signals to control at least the second voltage signal output from the driver circuit.

* * * * *